US008729521B2

(12) United States Patent
Lung et al.

(10) Patent No.: US 8,729,521 B2
(45) Date of Patent: May 20, 2014

(54) SELF ALIGNED FIN-TYPE PROGRAMMABLE MEMORY CELL

(75) Inventors: Hsiang-Lan Lung, Dobbs Ferry, NY (US); Matthew J. Breitwisch, Yorktown Heights, NY (US); Chung-Hon Lam, Peekskill, NY (US)

(73) Assignees: Macronix International Co., Ltd., Hsinchu (TW); International Business Machines Corporation, Armonk, NY (US)

( * ) Notice: Subject to any disclaimer, the term of this patent is extended or adjusted under 35 U.S.C. 154(b) by 815 days.

(21) Appl. No.: 12/778,897

(22) Filed: May 12, 2010

(65) Prior Publication Data

US 2011/0278528 A1    Nov. 17, 2011

(51) Int. Cl.
*H01L 45/00* (2006.01)
*H01L 21/20* (2006.01)

(52) U.S. Cl.
USPC .................................................. 257/3; 257/2

(58) Field of Classification Search
USPC .......................................... 257/3, 2
See application file for complete search history.

(56) References Cited

U.S. PATENT DOCUMENTS

| 3,271,591 | A | 9/1966 | Ovshinsky |
| 3,530,441 | A | 9/1970 | Ovshinsky |
| 3,846,767 | A | 11/1974 | Cohen |

(Continued)

FOREIGN PATENT DOCUMENTS

| CN | 1462478 A | 12/2003 |
| CN | 1828922 A | 9/2006 |

(Continued)

OTHER PUBLICATIONS

Im, D.H.; L et al., "A unified 7.5nm dash-type confined cell for high performance PRAM device," Electron Devices Meeting, 2008. IEDM 2008. IEEE International, vol., no., pp. 1-4, Dec. 15-17, 2008.

(Continued)

*Primary Examiner* — Matthew W Such
*Assistant Examiner* — Robert Carpenter
(74) *Attorney, Agent, or Firm* — Haynes Beffel & Wolfeld LLP

(57) ABSTRACT

A fin-type programmable memory cell includes a bottom electrode electrically coupled to an access device, a top electrode, and an L-shaped memory material element electrically coupled to the bottom and top electrodes. A memory array includes an array of such memory cells, electrically coupled to an array of access devices. Method for making a memory cell, includes: forming a dielectric support layer over a bottom electrode, the dielectric support layer having an upper surface; forming a cavity through the dielectric support layer, exposing a surface of the bottom electrode and defining a dielectric support structure having a sidewall; forming a film of memory material over the dielectric support structure and in the cavity; depositing a dielectric spacer layer over the memory material film; forming a dielectric sidewall spacer from the dielectric spacer layer and a memory material structure having a generally horizontal portion underlying the dielectric sidewall spacer and a generally vertical portion between the dielectric sidewall spacer and the sidewall of the dielectric support structure; forming a dielectric fill; planarizing the dielectric fill to expose upper ends of the vertical portion of the memory material structure; depositing a top electrode material over the planarized dielectric fill; and forming a top electrode from the top electrode material and a memory material element from the memory material structure.

11 Claims, 14 Drawing Sheets

(56) References Cited

U.S. PATENT DOCUMENTS

| | | |
|---|---|---|
| 4,452,592 A | 6/1984 | Tsai |
| 4,599,705 A | 7/1986 | Holmberg et al. |
| 4,719,594 A | 1/1988 | Young et al. |
| 4,769,339 A | 9/1988 | Ishii et al. |
| 4,876,220 A | 10/1989 | Mohsen et al. |
| 4,959,812 A | 9/1990 | Momodomi et al. |
| 5,106,775 A | 4/1992 | Kaga et al. |
| 5,166,096 A | 11/1992 | Cote et al. |
| 5,166,758 A | 11/1992 | Ovshinsky et al. |
| 5,177,567 A | 1/1993 | Klersy et al. |
| 5,332,923 A | 7/1994 | Takeuchi et al. |
| 5,391,901 A | 2/1995 | Tanabe et al. |
| 5,515,488 A | 5/1996 | Hoppe et al. |
| 5,534,712 A | 7/1996 | Ovshinsky et al. |
| 5,550,396 A | 8/1996 | Tsutsumi et al. |
| 5,687,112 A | 11/1997 | Ovshinsky |
| 5,688,713 A | 11/1997 | Linliu et al. |
| 5,716,883 A | 2/1998 | Tseng et al. |
| 5,754,472 A | 5/1998 | Sim et al. |
| 5,789,277 A | 8/1998 | Zahorik et al. |
| 5,789,758 A | 8/1998 | Reinberg |
| 5,814,527 A | 9/1998 | Wolstenholme et al. |
| 5,831,276 A | 11/1998 | Gonzalez et al. |
| 5,837,564 A | 11/1998 | Sandhu et al. |
| 5,869,843 A | 2/1999 | Harshfield |
| 5,879,955 A | 3/1999 | Gonzalez et al. |
| 5,902,704 A | 5/1999 | Schoenborn et al. |
| 5,920,788 A | 7/1999 | Reinberg |
| 5,933,365 A | 8/1999 | Klersy et al. |
| 5,952,671 A | 9/1999 | Reinberg et al. |
| 5,958,358 A | 9/1999 | Tenne et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan |
| 6,025,220 A | 2/2000 | Sandhu |
| 6,031,287 A | 2/2000 | Harshfield |
| 6,034,882 A | 3/2000 | Johnson et al. |
| 6,046,951 A | 4/2000 | El Hajji et al. |
| 6,066,870 A | 5/2000 | Siek |
| 6,075,719 A | 6/2000 | Lowrey et al. |
| 6,077,674 A | 6/2000 | Schleifer et al. |
| 6,077,729 A | 6/2000 | Harshfield |
| 6,087,269 A | 7/2000 | Williams |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,291,137 B1 | 9/2001 | Lyons et al. |
| 6,314,014 B1 | 11/2001 | Lowrey et al. |
| 6,316,348 B1 | 11/2001 | Fu et al. |
| 6,320,786 B1 | 11/2001 | Chang et al. |
| 6,326,307 B1 | 12/2001 | Lindley et al. |
| 6,337,266 B1 | 1/2002 | Zahorik |
| 6,339,544 B1 | 1/2002 | Chiang et al. |
| 6,351,406 B1 | 2/2002 | Johnson et al. |
| 6,372,651 B1 | 4/2002 | Yang et al. |
| 6,380,068 B2 | 4/2002 | Jeng et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,440,837 B1 | 8/2002 | Harshfield |
| 6,462,353 B1 | 10/2002 | Gilgen |
| 6,483,736 B2 | 11/2002 | Johnson et al. |
| 6,487,106 B1 | 11/2002 | Kozicki |
| 6,487,114 B2 | 11/2002 | Jong et al. |
| 6,501,111 B1 | 12/2002 | Lowrey |
| 6,511,867 B2 | 1/2003 | Lowrey et al. |
| 6,512,241 B1 | 1/2003 | Lai |
| 6,512,263 B1 | 1/2003 | Yuan et al. |
| 6,514,788 B2 | 2/2003 | Quinn |
| 6,514,820 B2 | 2/2003 | Ahn et al. |
| 6,534,781 B2 | 3/2003 | Dennison |
| 6,545,903 B1 | 4/2003 | Wu |
| 6,551,866 B1 | 4/2003 | Maeda et al. |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,576,546 B2 | 6/2003 | Gilbert et al. |
| 6,579,760 B1 | 6/2003 | Lung |
| 6,586,761 B2 | 7/2003 | Lowrey |
| 6,589,714 B2 | 7/2003 | Maimon et al. |
| 6,593,176 B2 | 7/2003 | Dennison |
| 6,596,589 B2 | 7/2003 | Tseng et al. |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,620,715 B1 | 9/2003 | Blosse et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,674,115 B2 | 1/2004 | Hudgens et al. |
| 6,677,678 B2 | 1/2004 | Biolsi et al. |
| 6,687,307 B1 | 2/2004 | Anikhindi et al. |
| 6,744,088 B1 | 6/2004 | Dennison |
| 6,746,892 B2 | 6/2004 | Lee et al. |
| 6,750,079 B2 | 6/2004 | Lowrey et al. |
| 6,750,101 B2 | 6/2004 | Lung et al. |
| 6,791,102 B2 | 9/2004 | Johnson et al. |
| 6,791,859 B2 | 9/2004 | Hush et al. |
| 6,797,979 B2 | 9/2004 | Chiang et al. |
| 6,800,504 B2 | 10/2004 | Li et al. |
| 6,800,563 B2 | 10/2004 | Xu |
| 6,805,563 B2 | 10/2004 | Ohashi |
| 6,808,991 B1 | 10/2004 | Tung |
| 6,815,704 B1 | 11/2004 | Chen |
| 6,830,952 B2 | 12/2004 | Lung |
| 6,838,692 B1 | 1/2005 | Lung et al. |
| 6,850,432 B2 | 2/2005 | Lu et al. |
| 6,859,389 B2 | 2/2005 | Idehara |
| 6,861,267 B2 | 3/2005 | Xu et al. |
| 6,864,500 B2 | 3/2005 | Gilton |
| 6,864,503 B2 | 3/2005 | Lung |
| 6,867,638 B2 | 3/2005 | Saiki et al. |
| 6,881,603 B2 | 4/2005 | Lai |
| 6,888,750 B2 | 5/2005 | Walker et al. |
| 6,894,304 B2 | 5/2005 | Moore |
| 6,894,305 B2 | 5/2005 | Yi et al. |
| 6,897,467 B2 | 5/2005 | Doan et al. |
| 6,900,517 B2 | 5/2005 | Tanaka et al. |
| 6,903,362 B2 | 6/2005 | Wyeth et al. |
| 6,909,107 B2 | 6/2005 | Rodgers et al. |
| 6,910,907 B2 | 6/2005 | Layadi et al. |
| 6,927,410 B2 | 8/2005 | Chen |
| 6,928,022 B2 | 8/2005 | Cho et al. |
| 6,933,516 B2 | 8/2005 | Xu |
| 6,936,544 B2 | 8/2005 | Huang et al. |
| 6,936,840 B2 | 8/2005 | Sun et al. |
| 6,937,507 B2 | 8/2005 | Chen |
| 6,943,365 B2 | 9/2005 | Lowrey et al. |
| 6,969,866 B1 | 11/2005 | Lowrey et al. |
| 6,972,428 B2 | 12/2005 | Maimon |
| 6,972,430 B2 | 12/2005 | Casagrande et al. |
| 6,977,181 B1 | 12/2005 | Raberg et al. |
| 6,992,932 B2 | 1/2006 | Cohen |

(56) References Cited

U.S. PATENT DOCUMENTS

| | | | |
|---|---|---|---|
| 6,998,289 B2 | 2/2006 | Hudgens et al. | |
| 7,023,008 B1 | 4/2006 | Happ | |
| 7,023,009 B2 | 4/2006 | Kostylev et al. | |
| 7,033,856 B2 | 4/2006 | Lung et al. | |
| 7,038,230 B2 | 5/2006 | Chen et al. | |
| 7,038,938 B2 | 5/2006 | Kang et al. | |
| 7,042,001 B2 | 5/2006 | Kim et al. | |
| 7,054,183 B2 | 5/2006 | Rinerson et al. | |
| 7,067,837 B2 | 6/2006 | Hwang et al. | |
| 7,067,864 B2 | 6/2006 | Nishida et al. | |
| 7,067,865 B2 | 6/2006 | Lung et al. | |
| 7,078,273 B2 | 7/2006 | Matsuoka et al. | |
| 7,099,180 B1 | 8/2006 | Dodge et al. | |
| 7,115,927 B2 | 10/2006 | Hideki et al. | |
| 7,122,281 B2 | 10/2006 | Pierrat | |
| 7,122,824 B2 | 10/2006 | Khouri et al. | |
| 7,126,149 B2 | 10/2006 | Iwasaki et al. | |
| 7,126,847 B2 | 10/2006 | Ha et al. | |
| 7,132,675 B2 | 11/2006 | Gilton | |
| 7,151,273 B2 | 12/2006 | Campbell et al. | |
| 7,154,774 B2 | 12/2006 | Bedeschi et al. | |
| 7,158,411 B2 | 1/2007 | Yeh et al. | |
| 7,164,147 B2 | 1/2007 | Lee et al. | |
| 7,166,533 B2 | 1/2007 | Happ | |
| 7,169,635 B2 | 1/2007 | Kozicki | |
| 7,202,493 B2 | 4/2007 | Lung et al. | |
| 7,208,751 B2 | 4/2007 | Ooishi et al. | |
| 7,214,958 B2 | 5/2007 | Happ | |
| 7,220,983 B2 | 5/2007 | Lung | |
| 7,229,883 B2 | 6/2007 | Wang et al. | |
| 7,238,959 B2 | 7/2007 | Chen | |
| 7,238,994 B2 | 7/2007 | Chen et al. | |
| 7,248,494 B2 | 7/2007 | Oh et al. | |
| 7,251,157 B2 | 7/2007 | Osada et al. | |
| 7,253,429 B2 | 8/2007 | Klersy et al. | |
| 7,254,059 B2 | 8/2007 | Li et al. | |
| 7,262,502 B2 | 8/2007 | Chang | |
| 7,269,052 B2 | 9/2007 | Segal et al. | |
| 7,277,317 B2 | 10/2007 | Le Phan et al. | |
| 7,291,556 B2 | 11/2007 | Choi et al. | |
| 7,309,630 B2 | 12/2007 | Fan et al. | |
| 7,314,776 B2 | 1/2008 | Johnson et al. | |
| 7,317,201 B2 | 1/2008 | Gutsche et al. | |
| 7,321,130 B2 | 1/2008 | Lung et al. | |
| 7,323,708 B2 | 1/2008 | Lee et al. | |
| 7,323,734 B2 | 1/2008 | Ha et al. | |
| 7,332,370 B2 | 2/2008 | Chang et al. | |
| 7,336,526 B2 | 2/2008 | Osada et al. | |
| 7,351,648 B2 | 4/2008 | Furukawa et al. | |
| 7,359,231 B2 | 4/2008 | Venkataraman et al. | |
| 7,364,935 B2 | 4/2008 | Lung et al. | |
| 7,365,385 B2 | 4/2008 | Abbott | |
| 7,379,328 B2 | 5/2008 | Osada et al. | |
| 7,385,235 B2 | 6/2008 | Lung et al. | |
| 7,388,273 B2 | 6/2008 | Burr et al. | |
| 7,394,088 B2 | 7/2008 | Lung | |
| 7,394,089 B2 | 7/2008 | Doyle et al. | |
| 7,397,060 B2 | 7/2008 | Lung | |
| 7,400,522 B2 | 7/2008 | Toda et al. | |
| 7,423,300 B2 | 9/2008 | Lung et al. | |
| 7,426,134 B2 | 9/2008 | Happ et al. | |
| 7,440,308 B2 | 10/2008 | Jeong et al. | |
| 7,449,710 B2 | 11/2008 | Lung | |
| 7,456,421 B2 | 11/2008 | Lung | |
| 7,473,576 B2 | 1/2009 | Lung | |
| 7,476,587 B2 | 1/2009 | Lung | |
| 7,479,649 B2 | 1/2009 | Lung | |
| 7,485,891 B2 | 2/2009 | Hamann et al. | |
| 7,488,968 B2 | 2/2009 | Lee | |
| 7,502,252 B2 | 3/2009 | Fuji et al. | |
| 7,504,653 B2 * | 3/2009 | Lung | 257/2 |
| 7,507,986 B2 | 3/2009 | Lung | |
| 7,514,334 B2 | 4/2009 | Chen et al. | |
| 7,514,705 B2 | 4/2009 | Breitwisch et al. | |
| 7,515,461 B2 | 4/2009 | Happ et al. | |
| 7,560,337 B2 | 7/2009 | Ho et al. | |
| 7,569,844 B2 | 8/2009 | Lung | |
| 7,569,845 B2 * | 8/2009 | Chen et al. | 257/3 |
| 7,599,216 B2 * | 10/2009 | Suh et al. | 365/163 |
| 7,642,125 B2 | 1/2010 | Lung et al. | |
| 7,683,360 B2 | 3/2010 | Chen et al. | |
| 7,688,619 B2 | 3/2010 | Lung et al. | |
| 7,696,503 B2 | 4/2010 | Lung et al. | |
| 7,701,759 B2 | 4/2010 | Lung et al. | |
| 7,755,076 B2 | 7/2010 | Lung | |
| 7,872,908 B2 * | 1/2011 | Suh et al. | 365/163 |
| 2002/0017701 A1 | 2/2002 | Klersy et al. | |
| 2002/0070457 A1 | 6/2002 | Sun et al. | |
| 2002/0113273 A1 | 8/2002 | Hwang et al. | |
| 2002/0168852 A1 | 11/2002 | Harshfield et al. | |
| 2003/0072195 A1 | 4/2003 | Mikolajick | |
| 2003/0095426 A1 | 5/2003 | Hush et al. | |
| 2003/0116794 A1 | 6/2003 | Lowrey | |
| 2003/0186481 A1 | 10/2003 | Lung | |
| 2004/0026686 A1 | 2/2004 | Lung | |
| 2004/0051094 A1 | 3/2004 | Ooishi | |
| 2004/0113137 A1 | 6/2004 | Lowrey | |
| 2004/0114317 A1 | 6/2004 | Chiang et al. | |
| 2004/0165422 A1 | 8/2004 | Hideki et al. | |
| 2004/0248339 A1 | 12/2004 | Lung | |
| 2004/0256610 A1 | 12/2004 | Lung | |
| 2005/0018526 A1 | 1/2005 | Lee | |
| 2005/0029267 A1 | 2/2005 | Martin et al. | |
| 2005/0029502 A1 | 2/2005 | Hudgens | |
| 2005/0052904 A1 | 3/2005 | Cho et al. | |
| 2005/0062087 A1 | 3/2005 | Chen et al. | |
| 2005/0093022 A1 | 5/2005 | Lung | |
| 2005/0127347 A1 | 6/2005 | Choi et al. | |
| 2005/0127349 A1 | 6/2005 | Horak et al. | |
| 2005/0141261 A1 | 6/2005 | Ahn | |
| 2005/0145984 A1 | 7/2005 | Chen et al. | |
| 2005/0167656 A1 | 8/2005 | Sun et al. | |
| 2005/0191804 A1 | 9/2005 | Lai et al. | |
| 2005/0195633 A1 | 9/2005 | Choi et al. | |
| 2005/0201182 A1 | 9/2005 | Osada et al. | |
| 2005/0212024 A1 | 9/2005 | Happ | |
| 2005/0212026 A1 | 9/2005 | Chung et al. | |
| 2005/0215009 A1 | 9/2005 | Cho | |
| 2005/0263829 A1 | 12/2005 | Song et al. | |
| 2006/0006472 A1 | 1/2006 | Jiang | |
| 2006/0018156 A1 | 1/2006 | Happ | |
| 2006/0038221 A1 | 2/2006 | Lee et al. | |
| 2006/0066156 A1 | 3/2006 | Dong et al. | |
| 2006/0073642 A1 | 4/2006 | Yeh et al. | |
| 2006/0091476 A1 | 5/2006 | Pinnow et al. | |
| 2006/0094154 A1 | 5/2006 | Lung | |
| 2006/0108667 A1 | 5/2006 | Lung | |
| 2006/0110878 A1 | 5/2006 | Lung et al. | |
| 2006/0110888 A1 | 5/2006 | Cho et al. | |
| 2006/0113520 A1 | 6/2006 | Yamamoto et al. | |
| 2006/0113521 A1 | 6/2006 | Lung | |
| 2006/0118913 A1 | 6/2006 | Yi et al. | |
| 2006/0124916 A1 | 6/2006 | Lung | |
| 2006/0126395 A1 | 6/2006 | Chen et al. | |
| 2006/0131555 A1 | 6/2006 | Liu et al. | |
| 2006/0138467 A1 | 6/2006 | Lung | |
| 2006/0154185 A1 | 7/2006 | Ho et al. | |
| 2006/0157680 A1 | 7/2006 | Takaura et al. | |
| 2006/0157681 A1 | 7/2006 | Chen et al. | |
| 2006/0163554 A1 | 7/2006 | Lankhorst et al. | |
| 2006/0169968 A1 | 8/2006 | Happ | |
| 2006/0172067 A1 | 8/2006 | Ovshinsky et al. | |
| 2006/0175599 A1 | 8/2006 | Happ | |
| 2006/0192193 A1 | 8/2006 | Lee et al. | |
| 2006/0197130 A1 * | 9/2006 | Suh et al. | 257/296 |
| 2006/0198183 A1 | 9/2006 | Kawahara et al. | |
| 2006/0202245 A1 | 9/2006 | Zuliani et al. | |
| 2006/0205108 A1 | 9/2006 | Maimon et al. | |
| 2006/0211165 A1 | 9/2006 | Hwang et al. | |
| 2006/0226409 A1 | 10/2006 | Burr et al. | |
| 2006/0234138 A1 | 10/2006 | Fehlhaber et al. | |
| 2006/0237756 A1 | 10/2006 | Park et al. | |
| 2006/0245236 A1 | 11/2006 | Zaidi | |
| 2006/0250885 A1 | 11/2006 | Cho et al. | |

(56) References Cited

U.S. PATENT DOCUMENTS

| | | |
|---|---|---|
| 2006/0261392 A1 | 11/2006 | Lee et al. |
| 2006/0266993 A1 | 11/2006 | Suh et al. |
| 2006/0281216 A1 | 12/2006 | Chang et al. |
| 2006/0284157 A1 | 12/2006 | Chen et al. |
| 2006/0284158 A1 | 12/2006 | Lung et al. |
| 2006/0284214 A1 | 12/2006 | Chen |
| 2006/0284279 A1 | 12/2006 | Lung et al. |
| 2006/0286709 A1 | 12/2006 | Lung et al. |
| 2006/0286743 A1 | 12/2006 | Lung et al. |
| 2006/0289847 A1 | 12/2006 | Dodge |
| 2006/0289848 A1 | 12/2006 | Dennison |
| 2007/0007613 A1 | 1/2007 | Wang et al. |
| 2007/0008786 A1 | 1/2007 | Scheuerlein |
| 2007/0010054 A1 | 1/2007 | Fan et al. |
| 2007/0030721 A1 | 2/2007 | Segal et al. |
| 2007/0037101 A1 | 2/2007 | Morioka |
| 2007/0040159 A1 | 2/2007 | Wang |
| 2007/0045606 A1 | 3/2007 | Magistretti et al. |
| 2007/0051936 A1 | 3/2007 | Pellizzer et al. |
| 2007/0096162 A1 | 5/2007 | Happ et al. |
| 2007/0096248 A1 | 5/2007 | Philipp et al. |
| 2007/0108077 A1 | 5/2007 | Lung et al. |
| 2007/0108429 A1 | 5/2007 | Lung |
| 2007/0108430 A1 | 5/2007 | Lung |
| 2007/0108431 A1 | 5/2007 | Chen et al. |
| 2007/0109836 A1 | 5/2007 | Lung |
| 2007/0109843 A1 | 5/2007 | Lung et al. |
| 2007/0111429 A1 | 5/2007 | Lung |
| 2007/0115794 A1 | 5/2007 | Lung |
| 2007/0117315 A1 | 5/2007 | Lai et al. |
| 2007/0120104 A1 | 5/2007 | Ahn et al. |
| 2007/0121363 A1 | 5/2007 | Lung |
| 2007/0121374 A1 | 5/2007 | Lung et al. |
| 2007/0126040 A1 | 6/2007 | Lung |
| 2007/0131922 A1 | 6/2007 | Lung |
| 2007/0131980 A1 | 6/2007 | Lung |
| 2007/0138458 A1 | 6/2007 | Lung |
| 2007/0147105 A1 | 6/2007 | Lung et al. |
| 2007/0153563 A1 | 7/2007 | Nirschl |
| 2007/0154847 A1 | 7/2007 | Chen et al. |
| 2007/0155172 A1 | 7/2007 | Lai et al. |
| 2007/0156949 A1 | 7/2007 | Rudelic et al. |
| 2007/0158632 A1 | 7/2007 | Ho |
| 2007/0158633 A1 | 7/2007 | Lai et al. |
| 2007/0158645 A1 | 7/2007 | Lung |
| 2007/0158690 A1 | 7/2007 | Ho et al. |
| 2007/0158862 A1 | 7/2007 | Lung |
| 2007/0161186 A1 | 7/2007 | Ho |
| 2007/0170881 A1 | 7/2007 | Noh et al. |
| 2007/0173019 A1 | 7/2007 | Ho et al. |
| 2007/0173063 A1 | 7/2007 | Lung |
| 2007/0176261 A1 | 8/2007 | Lung |
| 2007/0187664 A1 | 8/2007 | Happ |
| 2007/0201267 A1 | 8/2007 | Happ et al. |
| 2007/0215852 A1 | 9/2007 | Lung |
| 2007/0224726 A1 | 9/2007 | Chen et al. |
| 2007/0235811 A1 | 10/2007 | Furukawa et al. |
| 2007/0236989 A1 | 10/2007 | Lung |
| 2007/0246699 A1 | 10/2007 | Lung |
| 2007/0249090 A1 | 10/2007 | Philipp et al. |
| 2007/0252127 A1 | 11/2007 | Arnold et al. |
| 2007/0257300 A1 | 11/2007 | Ho et al. |
| 2007/0262388 A1 | 11/2007 | Ho et al. |
| 2007/0267618 A1 | 11/2007 | Zaidi et al. |
| 2007/0274121 A1 | 11/2007 | Lung et al. |
| 2007/0285960 A1 | 12/2007 | Lung et al. |
| 2007/0298535 A1 | 12/2007 | Lung |
| 2008/0006811 A1 | 1/2008 | Philipp et al. |
| 2008/0012000 A1 | 1/2008 | Harshfield |
| 2008/0014676 A1 | 1/2008 | Lung et al. |
| 2008/0025089 A1 | 1/2008 | Scheuerlein et al. |
| 2008/0043520 A1 | 2/2008 | Chen |
| 2008/0079091 A1 | 4/2008 | Park et al. |
| 2008/0094871 A1 | 4/2008 | Parkinson |
| 2008/0101110 A1 | 5/2008 | Happ et al. |
| 2008/0106923 A1 | 5/2008 | Lung |
| 2008/0137400 A1 | 6/2008 | Chen et al. |
| 2008/0138929 A1 | 6/2008 | Lung |
| 2008/0138930 A1 | 6/2008 | Lung |
| 2008/0138931 A1 | 6/2008 | Lung |
| 2008/0164453 A1 | 7/2008 | Breitwisch et al. |
| 2008/0165569 A1 | 7/2008 | Chen et al. |
| 2008/0165570 A1 | 7/2008 | Happ et al. |
| 2008/0165572 A1 | 7/2008 | Lung |
| 2008/0166875 A1 | 7/2008 | Lung |
| 2008/0179582 A1 | 7/2008 | Burr et al. |
| 2008/0180990 A1 | 7/2008 | Lung |
| 2008/0186755 A1 | 8/2008 | Lung et al. |
| 2008/0191187 A1 | 8/2008 | Lung et al. |
| 2008/0192534 A1 | 8/2008 | Lung |
| 2008/0197334 A1 | 8/2008 | Lung |
| 2008/0224119 A1 | 9/2008 | Burr et al. |
| 2008/0225489 A1 | 9/2008 | Cai et al. |
| 2008/0259672 A1 | 10/2008 | Lung |
| 2008/0265234 A1 | 10/2008 | Breitwisch et al. |
| 2008/0303014 A1 | 12/2008 | Goux et al. |
| 2008/0310208 A1 | 12/2008 | Daley |
| 2008/0316794 A1 | 12/2008 | Philipp et al. |
| 2009/0001341 A1 | 1/2009 | Breitwisch et al. |
| 2009/0014704 A1 | 1/2009 | Chen et al. |
| 2009/0017577 A1 | 1/2009 | An et al. |
| 2009/0023242 A1 | 1/2009 | Lung |
| 2009/0027950 A1 | 1/2009 | Lam et al. |
| 2009/0042335 A1 | 2/2009 | Lung |
| 2009/0057641 A1 | 3/2009 | Lung |
| 2009/0072215 A1 | 3/2009 | Lung et al. |
| 2009/0072216 A1 | 3/2009 | Lung et al. |
| 2009/0098678 A1 | 4/2009 | Lung |
| 2009/0166603 A1 | 7/2009 | Lung |
| 2009/0268507 A1 | 10/2009 | Breitwisch et al. |
| 2009/0289241 A1* | 11/2009 | Suh et al. ............ 257/2 |
| 2009/0289242 A1 | 11/2009 | Breitwisch et al. |
| 2009/0294748 A1 | 12/2009 | Breitwisch et al. |
| 2010/0055830 A1 | 3/2010 | Chen et al. |
| 2010/0065808 A1 | 3/2010 | Lung et al. |
| 2010/0084624 A1 | 4/2010 | Lung et al. |
| 2010/0237316 A1 | 9/2010 | Lung |
| 2011/0049458 A1* | 3/2011 | Ahn et al. ............ 257/2 |

FOREIGN PATENT DOCUMENTS

| | | |
|---|---|---|
| WO | 0079539 A1 | 12/2000 |
| WO | 0145108 A1 | 6/2001 |
| WO | 2004025659 A1 | 3/2004 |

OTHER PUBLICATIONS

Xie et al, "Analysis of higher order pitch division for sub-32nm lithography", Optical Microlithography XXII, edited by Harry J. Levinson, Mircea V. Dusa, Proc. of SPIE vol. 7274.

"Magnetic Bit Boost," www.sciencenews.org, Dec. 18 & 25, 2004, p. 389, vol. 166.

"New Memories Tap Spin, Gird for Battle," Science News, Apr. 3, 1999, p. 223, vol. 155.

"Optimized Thermal Capacitance in a Phase Change Memory Cell Design," IPCOM000141986D, IP.com Prior Art Database, Oct. 18, 2006, 4pp.

"Remembering on the Cheap," www.sciencenews.org, Mar. 19, 2005, p. 189, vol. 167.

"Thermal Conductivity of Crystalline Dielectrics" in CRC Handbook of Chemistry and Physics, Internet Version 2007, (87th edition), David R. Lide, ed. Taylor and Francis, Boca Raton, Fl, 2pp.

Adler, D. et al., "Threshold Switching in Chalcogenide-Glass Thin Films," J. Appl/Phys 51(6), Jun. 1980, pp. 3289-3309.

Adler, David, "Amorphous-Semiconductor Devices," Sci. Amer., vol. 236, pp. 36-48, May 1977.

Ahn, S. J. et al., "A Highly Manufacturable High Density Phase Change Memory of 64 Mb and Beyond," IEEE IEDM Dec. 13-15, 2004, pp. 907-910.

Ahn, S. J. et al., "Highly Reliable 5nm Contact Cell Technology for 256Mb PRAM," VLSI Technology, Digest of Technical Papers, Jun. 14-16, 2005, pp. 98-99.

(56) References Cited

OTHER PUBLICATIONS

Atwood, G, et al., "90 nm Phase Change Technology with u Trench and Lance Cell Elements," VLSI Technology, Systems and Applications, Apr. 23-25, 2007, pp. 1-2.

Axon Technologies Corporation paper: Technology Description, published at least as early as Dec. 1997, pp. 1-6.

Bedeschi, F. et al., "4-MB MOSFET-Selected Phase-Change Memory Experimental Chip," IEEE, Sep. 21 to 23, 2004, 4 PP.

Blake thesis, "Investigation of GeTeSb5 Chalcogenide Films for Use as an Analog Memory," AFIT/GE/ENG/00M-04, Mar. 2000, 121 pages.

Chao, Der-Sheng, et al., "Low Programming Current Phase Change Memory Cell with Double GST Thermally Confined Structure," Int'l Symp on VLSI Technology, Systems and Applications, Apr. 23-25, 2007, pp. 1-2.

Chen, AN et al., "Non-Volatile Resistive Switching for Advanced Memory Applications," IEEE IEDM, Dec. 5-7, 2005, 4 pp.

Cho, S. L. et al., "Highly Scalable On-axis Confined Cell Structure for High Density PRAM beyond 256Mb," Jun. 14-16, 2005 Symposium on VLSI Technology Digest of Technical Papers, pp. 96-97.

Gibson, G. A. et al., "Phase-change Recording Medium that Enables Ultrahigh-density Electron-beam Data Storage," Applied Physics Letter, 2005, 3 pp., vol. 86.

Gill, Manzur et al., "A High-Performance Nonvolatile Memory Technology for Stand-Alone Memory and Embedded Applications," Feb. 3-7, 2002 IEEE-ISSCC Technical Digest (TD 12.4), 7 pp.

Gleixner, "Phase Change Memory Reliability", 22nd NVSMW, Aug. 26, 2007, 46 pages.

Ha, Y. H. et al., "An Edge Contact Type Cell for Phase Change RAM Featuring Very Low Power Consumption," Jun. 10-12, 2003 Symposium on VLSI Technology Digest of Technical Papers, pp. 175-176.

Hanzawa, Satoru, et al., "A 512kB Embedded Phase Change Memory with 416kB/s Write Throughput at 100mA Cell Write Current," ISSCC 2007, Session 26, Non-Volatile Memories/26.2, 3 pages.

Happ, T. D. et al., "Novel None-Mask Self-Heating Pillar Phase Change Memory," 2006 Symposium on VLSI Technology, 2 pp.

Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4pp.

Horii, H. et al., "A Novel Cell Technology Using N-doped GeSbTe Films for Phase Change RAM," Jun. 10-12, 2003 Symposium on VLSI Technology Digest of Technical Papers, pp. 177-178.

Hudgens, S. et al., "Overview of Phase-Change Chalcogenide Nonvolatile Memory Technology," MRS Bulletin, Nov. 2004, pp. 829-832.

Hwang, Y. N. et al., "Full Integration and Reliability Evaluation of Phase-change RAM Based on 0.24um-CMOS Technologies," Jun. 10-12, 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA 2004, pp. 28-29 and workshop cover sheet.

Kim, Kinam et al., "Reliability Investigations for Manufacturable High Density PRAM," IEEE 43rd Annual International Reliability Physics Symposium, San Jose, Apr. 17-21, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L., "Electrothermal and Phase-change Dynamics in Chalcogenide-based Memories," IEEE IEDM Dec. 13-15, 2004, 4 pp.

Lai, Stefan, "Current Status of the Phase Change Memory and Its Future," IEEE IEDM Dec. 10, 2003, pp. 255-258.

Lai, Stephan et al., "OUM-A 180 nm Nonvolatile Memory Cell Element Technology for Stand Alone and Embedded Applications," IEEE IEDM Dec. 2-5, 2001, pp. 803-806.

Lankhorst, Martijn H.R., et al; Low-Cost and Nanoscale Non-Volatile Memory Concept for Future Silicon Chips, Mar. 13, 2005, 6 pp., Nature Materials Advance Online Publication, www.nature.com/naturematerials.

Li, Yiming, "Temperature dependence on the contact size of GeSbTe films for phase change memories," J. Comput Electron (2008) 7:138-141.

Mott, Nevill, "Electrons in Glass," Nobel Lecture, Dec. 8, 1977, Physics, 1977, pp. 403-413.

Oh, Hyung-Rok, et al., "Enhanced Write Performance of a 64Mb Phase-Change Random Access Memory," ISSCC 2005, Session 2, Non-Volatile Memory, 2.3, 3 pages.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al.,"Novel u Trench Phase—Change Memory Cell for Embedded and Stand-Alone Non-Volatile Memory Applications," Jun. 15-17, 2004 Symposium on VLSI Technology Digest of Technical Papers, pp. 18-19.

Pirovano, Agostino et al.,"Reliability Study of Phase-Change Nonvolatile Memories," IEEE Transactions on Device and Materials Reliability, Sep. 2004, pp. 422-427, vol. 4, No. 3.

Prakash, S. et al., "A guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

Rochefort, C. et al., "Manufacturing of High Aspect-Ration p-n Junctions Using Vapor Phase Doping for Application in Multi-Resurf Devices," IEEE Jun. 4-7, 2002, pp. 237-240.

Schafft, Harry A. et al., "Thermal Conductivity Measurements of Thin Films Silicon Dioxide," Proceedings of the IEEE 1989 International Conference on Microelectronic Test Structures vol. 2, No. 1, Mar. 1989, pp. 121-124.

Strauss, Karl F. et al., "Overview of Radiation Tolerant Unlimited Write Cycle Non-Volatile Memory," IEEE Mar. 18-25, 2000, pp. 399-408.

Subramanian, Vivek et al., "Low Leakage Germanium-Seeded Laterally-Crystallized Single-Grain 100-nm TFT's for Vertical Integration Applications," IEEE Electron Device Letters, vol. 20, No. 7, Jul. 1999, pp. 341-343.

Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change%20memory', 8pages.

Wicker, Guy, "A Comprehensive Model of Submicron Chalcogenide Switching Devices," Doctoral Dissertation, Wayne State University, Detroit, MI 1996, 137 pp.

Wolf, Stanley, Excerpt from: Silicon Processing for the VLSI Era—vol. 4, pp. 674-679, 2004.

Wuttig, Matthias, "Towards a Universal Memory?" Nature Materials, Apr. 2005, pp. 265-266, vol. 4.

Yamada, Noboru, "Potential of Ge-Sb-Te phase-change optical disks for high-data-rate recording in the near future," (Conference Proceedings Paper), Jul. 30, 1997, vol. 3109, 10 pages.

Yi, J. H. et al., "Novel Cell Structure of PRAM with Thin Metal Layer Inserted GeSbTe," IEEE IEDM Dec. 10, 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

* cited by examiner

SELF ALIGNED FIN-TYPE PROGRAMMABLE MEMORY CELL

BACKGROUND

This invention relates to high density memory devices based on phase change memory materials, including chalcogenide based materials and on other programmable resistance materials, and methods for manufacturing such devices.

Phase change based memory materials, like chalcogenide based materials and similar materials, can be caused to change phase between an amorphous state and a crystalline state by application of electrical current at levels suitable for implementation in integrated circuits. The generally amorphous state is characterized by higher electrical resistivity than the generally crystalline state, which can be readily sensed to indicate data. These properties have generated interest in using programmable resistance material to form non-volatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or breakdown the crystalline structure, after which the phase change material cools quickly, quenching the molten phase change material and allowing at least a portion of the phase change material to stabilize in the amorphous state.

The magnitude of the current needed for reset can be reduced by reducing the size of the phase change material element in the cell and/or the contact area between electrodes and the phase change material, so that higher current densities are achieved with small absolute current values through the phase change material.

The size of the phase change element in a memory cell may be reduced by confining it to a narrow volume. In one approach to forming a confined cell structure, a fin-shaped bottom electrode element is formed and then recessed to provide a narrow slot into which the phase change material is deposited. This process presents challenges because it requires that the phase change material fill in a very narrow seam. Moreover, the resulting phase change material fin has a limited height, limiting the power saving performance of the cell.

SUMMARY

In general, the invention features a memory cell having a bottom electrode electrically coupled to an access device, a top electrode, and an L-shaped memory material element electrically coupled to the bottom and top electrodes.

The L-shaped memory element includes a generally horizontal base portion and an upright portion. The upright (fin-shaped) portion is formed by depositing a film of memory material onto a sidewall of a broad trench, and it may be formed to as great a height as desired.

In one general aspect the invention features a memory cell, including a bottom electrode, a top electrode, and an L-shaped memory material element having a generally horizontal base portion and an upright portion electrically coupled to the bottom and top electrodes. In some embodiments a base portion of the memory material element is in contact with a contact surface of the bottom electrode. In some embodiments a surface at the upper end of the upright portion of the memory material element is in contact with the top electrode; in other embodiments a memory material layer underlies the top electrode, and the surface at the upper end of the upright portion of the memory material element is in contact with the memory material layer.

The contact surface at the upper end of the upright portion of the memory material structure is generally planar, and lies in a plane generally parallel to the plane of the contact surface of the bottom electrode, and transverse to the upright portion of the L-shaped memory material structure.

In some embodiments the memory material element includes a programmable resistance material. In some such embodiments the programmable resistance material includes a phase change memory material, and in some such embodiments the phase change memory material includes a chalcogenide based material such as a Ge—Sb—Te ("GST") alloy.

In another general aspect the invention features a memory array having an array of memory cells including L-shaped memory material elements electrically coupled to bottom and top electrodes. The bottom electrodes are electrically coupled to an array of access devices, which are electrically coupled to word lines, and the top electrodes are electrically coupled to (or constitute) bit lines.

In some embodiments the access devices include transistors; in some embodiments the transistors include field effect transistors ("FET") and in some embodiments the transistors include bipolar junction transistors ("BJT"); in some embodiments the access devices include diodes; in some embodiments the access devices include BJT devices.

In another general aspect the invention features a method for making a memory cell, by: forming a dielectric support layer over a bottom electrode, the dielectric support layer having an upper surface; forming a cavity through the dielectric support layer, exposing a surface of the bottom electrode and defining a dielectric support structure having a sidewall; forming a film of memory material over the dielectric support structure and in the cavity; depositing a dielectric spacer layer over the memory material film; forming a dielectric sidewall spacer from the dielectric spacer layer and a memory material structure having a generally horizontal portion underlying the dielectric sidewall spacer and a generally vertical portion between the dielectric sidewall spacer and the sidewall of the dielectric support structure; forming a dielectric fill; planarizing the dielectric fill to expose upper ends of the vertical portion of the memory material structure; depositing a top electrode material over the planarized dielectric fill; and forming a top electrode from the top electrode material and a memory material element from the memory material structure.

Because the surface of the upper end of the vertical portion of the memory material structure is formed as a result of planarization of the filled structure, this surface is generally planar, and lies in a plane generally parallel to the plane of the surface of the bottom electrode, and transverse to the vertical portion of the L-shaped memory material structure.

In some embodiments the method further comprises, prior to forming the top electrode material over the planarized dielectric fill, forming a memory material layer over the planarized dielectric fill.

In some embodiments forming the dielectric support layer includes depositing a layer of a dielectric material such as an oxide, for example a silicon oxide, or a thermally insulative material. In some embodiments forming the cavity through the dielectric support layer includes a patterned etch, such as by a photolithographic technique. In some embodiments forming the memory material film includes forming a film of a phase change material such as a GST material, and in some such embodiments forming the phase change material includes vapor deposition such as chemical vapor deposition.

In some embodiments depositing the dielectric spacer layer includes depositing a layer of a dielectric material such as an oxide, for example a silicon oxide, or a thermally insulative material. In some embodiments forming the dielectric sidewall spacer and forming the memory material structure is carried out in stages. In some embodiments forming the dielectric sidewall spacer includes anisotropically etching the dielectric spacer layer, using a directional etch such as a directional plasma etch. In some embodiments forming the memory material structure includes etching portions of the memory material film not covered by the dielectric sidewall spacer. In some embodiments forming the dielectric fill includes depositing a dielectric material such as a nitride (e.g., a silicon nitride) or an oxide (e.g., a silicon oxide), for example. In some embodiments planarizing the dielectric fill includes carrying out a chemical mechanical polish ("CMP"). In some embodiments forming the top electrode and forming the memory material element include one or more patterned etches, such as by a photolithographic technique.

In another general aspect the invention features a method for making a memory array having an array of memory cells, by: providing an array of bottom electrodes electrically coupled to an array of access devices, which are electrically coupled to word lines; forming a dielectric support layer over the array of bottom electrodes, the dielectric support layer having an upper surface; forming a cavity through the dielectric support layer, defining a dielectric support structure having a sidewall and exposing surfaces of bottom electrodes adjacent the sidewall; forming a film of memory material over the dielectric support structure and in the cavity; depositing a dielectric spacer layer over the memory material film; forming a dielectric sidewall spacer from the dielectric spacer layer and a memory material structure having a generally horizontal portion underlying the dielectric sidewall spacer and a generally vertical portion between the dielectric sidewall spacer and the sidewall of the dielectric support structure; forming a dielectric fill; planarizing the dielectric fill to expose upper ends of the vertical portion of the memory material structure; depositing a top electrode material over the planarized dielectric fill; and forming top electrodes from the top electrode material and memory material elements from the memory material structure.

The method of the invention for forming the self-aligned memory material element does not require deposition of the memory material in a narrow space. The method is straightforward and can reliably provide a thin fin-shaped memory material element having improved height. In various embodiments, in the fin-type memory cell of the invention a narrowly confined fin-shaped programmable memory material element can provide for reduced reset power requirements and, accordingly, reduced reset current. The cell size can be reduced accordingly, and requirements for driving the device in the memory array can be relaxed.

DETAILED DESCRIPTION

The invention will now be described in further detail by reference to the drawings, which illustrate alternative embodiments of the invention. The drawings are diagrammatic, showing features of the invention and their relation to other features and structures, and are not made to scale. For improved clarity of presentation, in the Figures illustrating embodiments of the invention, elements corresponding to elements shown in other drawings are not all particularly renumbered, although they are all readily identifiable in all the Figures. Also for clarity of presentation certain features are not shown in the Figures, where not necessary for an understanding of the invention.

Figure 1A:
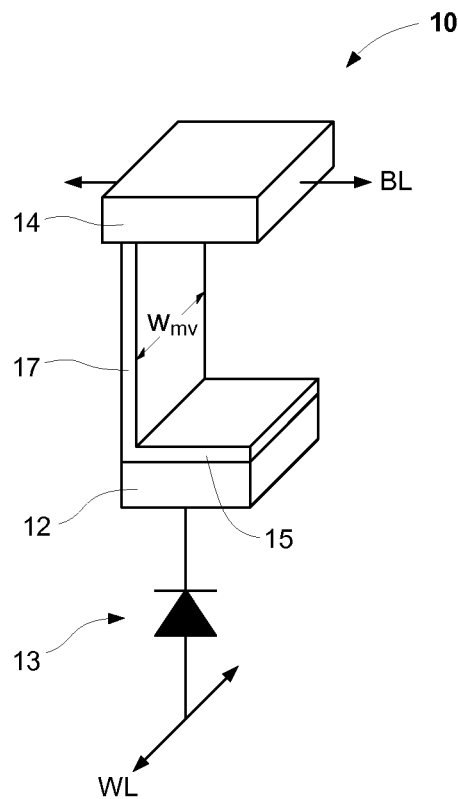
FIG. 1A is a diagrammatic sketch in a three-dimensional view showing a phase change memory unit cell according to an embodiment.
Figure 1C:
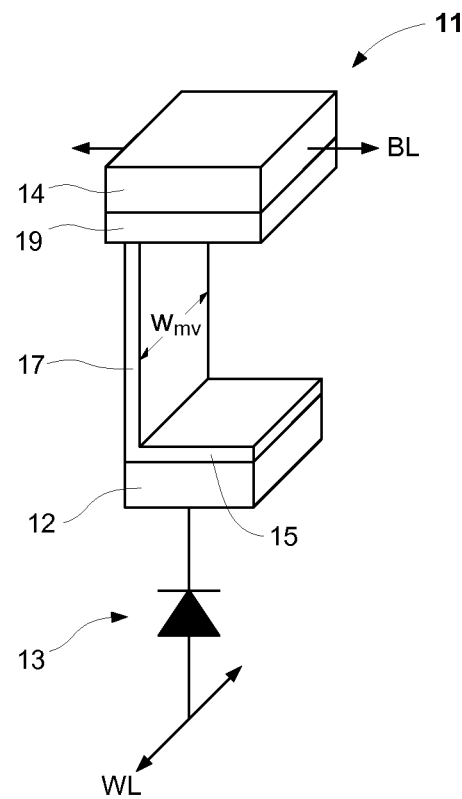
FIG. 1C is a diagrammatic sketch in a three-dimensional view showing a phase change memory unit cell according to another embodiment.
Figure 1B:
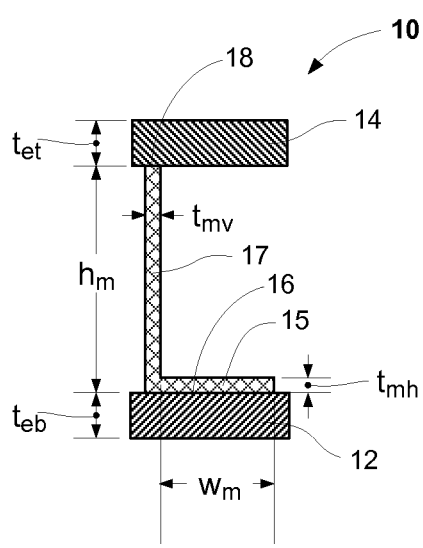
FIG. 1B is a diagrammatic sketch in a sectional view showing a phase change memory unit cell as in FIG. 1A.

FIGS. 1A and 1B show generally at 10 a unit cell according to an embodiment. The cell includes a bottom electrode 12 electrically coupled to an access device 13. The access device is electrically coupled to a word line ("WL"). In the illustrated example the access device is a diode.

An L-shaped memory material element overlies the bottom electrode 12. The memory material element has an upright portion 17 and a base portion 15. The base portion 15 in this example is in contact with a contact surface 16 of bottom electrode 12. A narrow surface 18 of the upper end of the upright portion 17 of the L-shaped memory material element in this example is in contact with a contact surface of a top electrode 14. In this example the top electrode constitutes a bit line ("BL"). The current path runs between the bottom electrode 12 and the top electrode 14 by way of the (fin-shaped) upright portion 17 of the memory element and, accordingly, this programmable resistance memory device may be referred a "fin-type" device.

Figure 1D:
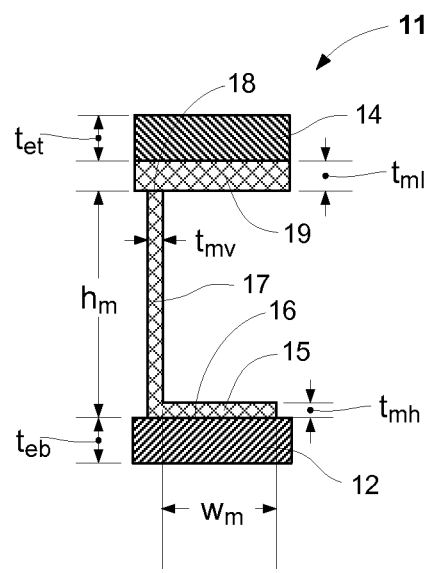
FIG. 1D is a diagrammatic sketch in a sectional view showing a phase change memory unit cell as in FIG. 1C.

FIGS. 1C and 1D show generally at 11a unit cell according to another embodiment. This cell is similar to that of FIGS. 1A and 1D and additionally includes a memory material layer 19 interposed between the upright portion 17 of the L-shaped memory material element and the top electrode 14. As in the embodiment of FIGS. 1A and 1B, the cell includes a bottom electrode 12 electrically coupled to an access device 13, electrically coupled to a word line ("WL") which, in this example is a diode. An L-shaped memory material element overlying the bottom electrode 12 has an upright portion 17 and a base portion 15. The base portion 15 in this example is in contact with a contact surface 16 of bottom electrode 12. A narrow surface 18 of the upper end of the upright portion 17 of the L-shaped memory material element in this example is in contact with a contact surface of the memory material layer 19. In this example the top electrode constitutes a bit line ("BL"). This device may also be referred to as a fin-type device, as the current path runs between the bottom electrode 12 and the top electrode 14 by way of the (fin-shaped) upright portion 17 of the memory element and the memory material layer 19. The interposed memory material layer 19 can provide improved thermal isolation of the cells.

The memory cell structure provides several advantageous features, and FIGS. 1A, 1B, 1C and 1D show. The volume of memory material in the memory element can be very small, having a thickness determined by the thickness of a deposited film of memory material. FIGS. 1B and 1D make reference to various dimensions that may be of interest. Particularly, the thickness ($t_{mv}$) of the fin-shaped upright portion 17 is very small, and the height ($h_m$) of the fin-shaped upright portion 17 is large. In various embodiments the thickness ($t_{mv}$) can be as little as about 1 nm and may be in a range about 1 nm to about 50 nm, usually in a range about 5 nm to about 15 nm, and in particular examples about 8 nm; and in various embodiments the height ($h_m$) can be as little as about 10 nm and may be in a range about 10 nm to about 200 nm, usually in a range about 20 nm to about 100 nm, and in particular examples about 50 nm. To provide suitable electrical contact, the contact area of the surface 18 of the upright portion 17 with the upper electrode 14 (or, in other embodiments, with the memory material layer 19) can be as small as about the square of the minimum feature size (for example, about 25 $nm^2$ where the minimum feature size is 5 nm), and may be in a range about 25 $nm^2$ to about 2500 $nm^2$, usually in a range about 100 $nm^2$ to about 500 $nm^2$, and in particular examples about 200 $nm^2$. Other dimensions are discussed in the following description of stages in a method for fabricating a memory cell array according to an embodiment.

Figure 19:
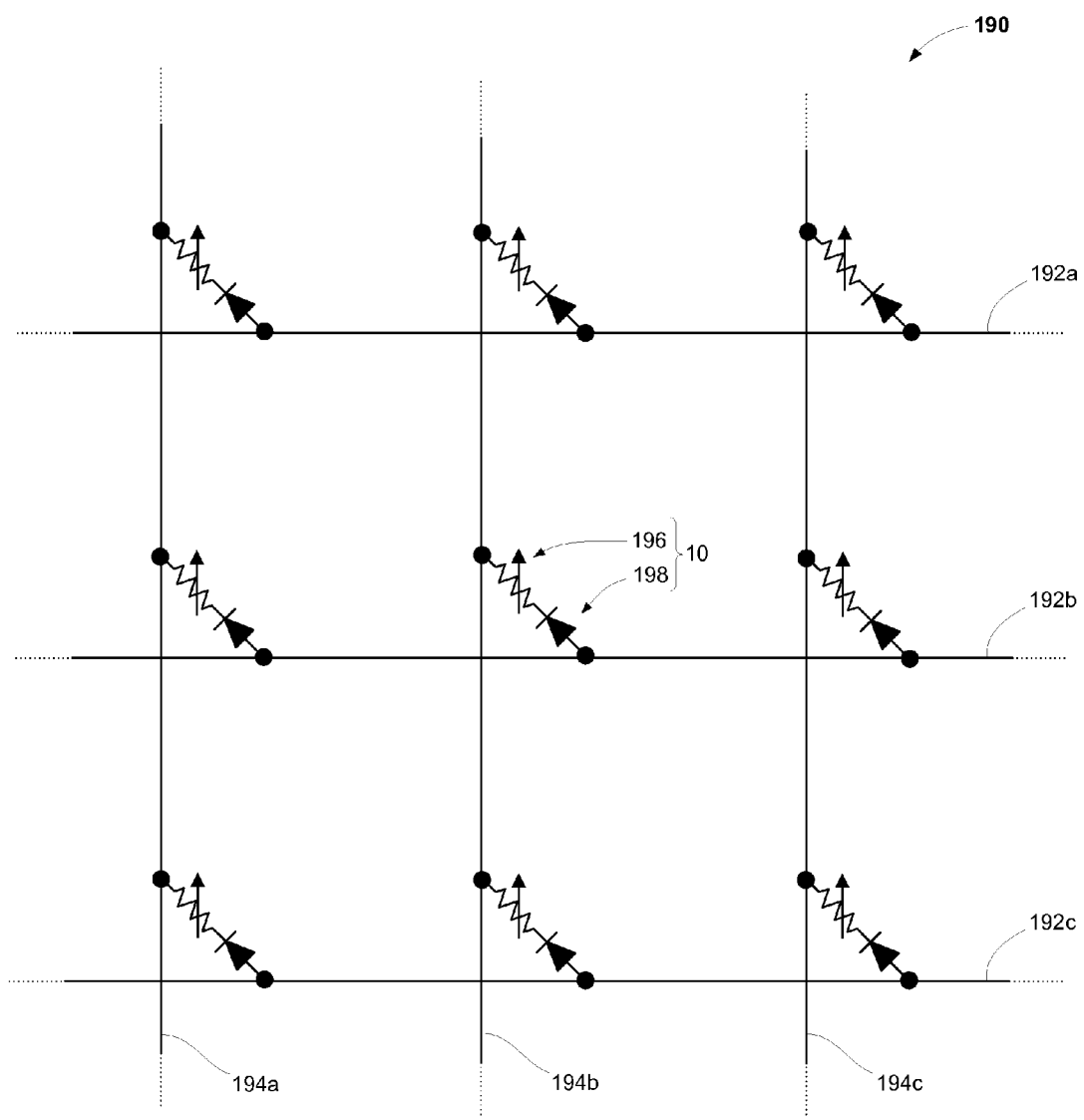
FIG. 19 is a schematic diagram for a memory array implemented using memory cells as described herein.

FIG. 19 is a schematic illustration of a memory array 190, which can be implemented using memory cells as described herein. In this example, each memory cell 10 includes a diode access device 198 and a fin-type programmable resistance memory element 196 (represented as a variable resistor) arranged in series along a current path between a corresponding word line 192 and a corresponding bit line 194. As described in more detail below, the memory element in a given memory cell is programmable to a plurality of resistance states including a first and a second resistance state.

The array comprises a plurality of word lines 192 including word lines 192a, 192b, and 192c extending in parallel in a first direction, and a plurality of bit lines 194 including bit lines 194a, 194b, and 194c extending in parallel in a second direction perpendicular to the first direction. The array 190 is referred to as a cross-point array because the word lines 192 and bit lines 194 cross each other but do not physically intersect, and the memory cells 10 are located at these cross-point locations of the word lines 192 and bit lines 194.

Memory cell 10 is representative of the memory cells of array 190 and is arranged at the cross-point location of the word line 192b and the bit line 194b, the memory cell 10 including a diode 198 and a memory element 196 arranged in series. The diode 198 is electrically coupled to the word line 192b and the memory element 196 is electrically coupled to the bit line 194b.

Reading or writing to memory cell 10 of array 190 can be achieved by applying appropriate voltage pulses to the corresponding word line 192b and bit line 194b to induce a current through the selected memory cell 10. The level and duration of the voltages applied is dependent upon the operation performed, e.g., a reading operation or a programming operation.

Figure 20:
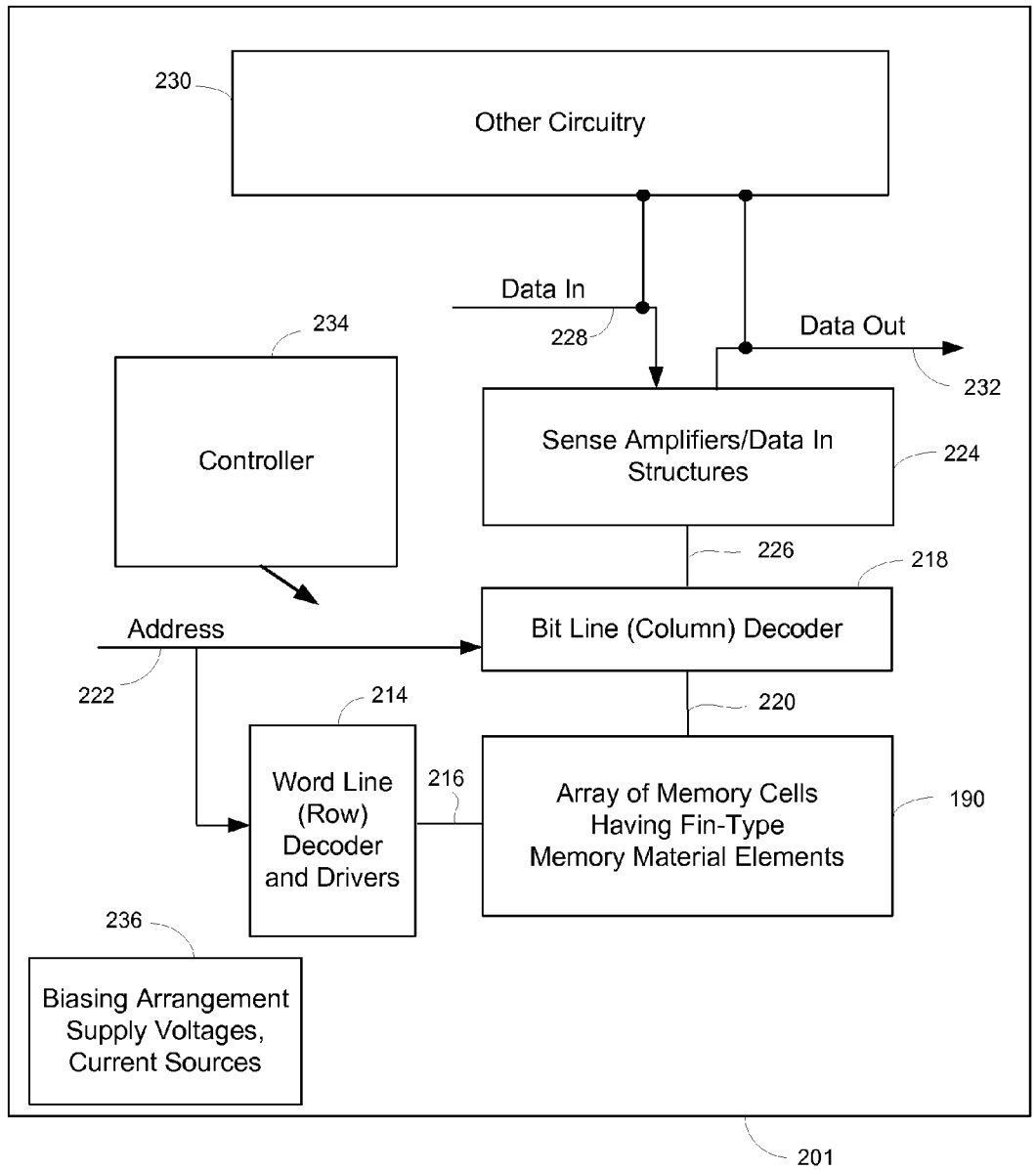
FIG. 20 is a simplified block diagram of an integrated circuit including an array of memory cells having a diode access devices and fin-type memory elements as described herein.

In a read (or sense) operation of the data value stored in the memory cell 10, bias circuitry (see, e.g., biasing arrangement supply voltages, current sources 236 of FIG. 20) coupled to the corresponding word line 192b and bit line 194b to apply bias arrangements across the memory cell 10 of suitable amplitude and duration to induce current to flow which does not result in the memory element 196 undergoing a change in resistive state. The current through the memory cell 10 is dependent upon the resistance of the memory element 196 and, thus, upon the data value stored in the memory cell 10. The data value may be determined, for example, by comparison of the current on the bit line 194b with a suitable reference current by sense amplifiers (see, e.g., sense amplifiers/data in structures 224 of FIG. 20).

In a program operation of a data value to be stored in the memory cell 10, bias circuitry (see, e.g., biasing arrangement supply voltages, current sources 236 of FIG. 20) coupled to the corresponding word line 192b and bit line 194b to apply bias arrangements across the memory cell 10 of suitable amplitude and duration to induce a programmable change in the memory element 196 to store the data value in the memory cell 10, the electrical resistance of the memory element 196 corresponding to the data value stored in the memory cell 10.

The bias arrangements include a first bias arrangement sufficient to forward bias the diode 198 and change the resistance state of the memory element 10 from a resistance corresponding to a first programmed state to a resistance corresponding to a second programmed state. The bias arrangements also include a second bias arrangement sufficient to forward bias the diode 198 and change the resistance state of the memory element 10 from a resistance corresponding to the second programmed state to a resistance corresponding to the first programmed state. In various embodiments the bias arrangements for unipolar operation of the memory element 10 may each comprise one or more voltage pulses, and the voltage levels and pulse times can be determined empirically for each embodiment.

FIG. 20 is a simplified block diagram of an integrated circuit 201 including a cross-point memory array 190 of memory cells. In this example, each memory cell includes a diode access device and a fin-type programmable resistance memory element as described herein. A word line (row) decoder 214 is coupled to and in electrical communication with a plurality of word lines 216. A bit line (column) decoder 218 is in electrical communication with a plurality of bit lines 220 to read data from, and write data to, the memory cells (not shown) in array 190. Addresses are supplied on bus 222 to word line decoder and drivers 214 and bit line decoder 218. Sense amplifiers and data-in structures in block 224 are coupled to bit line decoder 218 via data bus 226. Data are supplied via a data-in line 228 from input/output ports on integrated circuit 201, or from other data sources internal or external to integrated circuit 201, to data-in structures in block 224. Other circuitry 230 may be included on integrated circuit 201, such as a general purpose processor or special purpose application circuitry, or a combination of modules providing system-on-a-chip functionality supported by array 190. Data are supplied via a data-out line 232 from the sense amplifiers in block 224 to input/output ports on integrated circuit 201, or to other data destinations internal or external to integrated circuit 201.

A controller 234 implemented in this example, using a bias arrangement state machine, controls the application of bias arrangement supply voltages 236, such as read, program, and program verify voltages. Controller 234 may be implemented using special-purpose logic circuitry as known in the art. In alternative embodiments, controller 234 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 234.

Embodiments of the programmable resistance material of the memory material element include phase change based memory materials, including chalcogenide based materials and other materials. Chalcogens include any of the four elements oxygen (O), sulfur (S), selenium (Se), and tellurium (Te), forming part of group VIA of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IVA of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_a Ge_b Sb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky U.S. Pat. No. 5,687,112, columns 10-11.) Particular alloys evaluated by another researcher include $Ge_2Sb_2Te_5$, $GeSb_2Te_4$ and $GeSb_4Te_7$ (Noboru Yamada, "Potential of Ge—Sb—Te Phase-Change Optical Disks for High-Data-Rate Recording", SPIE v. 3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistance properties. Specific examples of memory materials that may be useful are given in Ovshinsky '112 at columns 11-13, which examples are hereby incorporated by reference.

Other materials, which may be termed "impurities" may be added to chalcogenides and other phase change materials in some embodiments to modify conductivity, transition temperature, melting temperature, and other properties of memory elements using the additive-modified chalcogenides. Representative impurities used as additives for chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide. See, e.g., U.S. Pat. No. 6,800,504, and U.S. patent Application Publication No. U.S. 2005/0029502.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$.

Other programmable resistance memory materials may be used in other embodiments of the invention, including other materials that use different crystal phase changes to determine resistance, or other memory materials that use an electrical pulse to change the resistance state. Examples include materials for use in resistance random access memory (RRAM) such as metal-oxides including tungsten-oxide ($WO_x$), NiO, $Nb_2O_5$, $CuO_2$, $Ta_2O_5$, $Al_2O_3$, CoO, $Fe_2O_3$, $HfO_2$, $TiO_2$, $SrTiO_3$, $SrZrO_3$, $(BaSr)TiO_3$. Additional examples include materials for use in magnetoresistance random access memory (MRAM) such as spin-torque-transfer (STT) MRAM, for example at least one of CoFeB, Fe, Co, Ni, Gd, Dy, CoFe, NiFe, MnAs, MnBi, MnSb, $CrO_2$, $MnOFe_2O_3$, $FeOFe_2O_5$, $NiOFe_2O_3$, $MgOFe_2$, EuO, and $Y_3Fe_5O_{12}$. See, e.g., U.S. Patent Application Publication No. 2007/0176251, titled "Magnetic Memory Device and Method of Fabricating the Same", which is incorporated by reference herein. Additional examples include solid electrolyte materials used for programmable-metallization-cell (PMC) memory, or nano-ionic memory, such as silver-doped germanium sulfide electrolytes and copper-doped germanium sulfide electrolytes. See, e.g., N. E. Gilbert et al., "A macro model of programmable metallization cell devices," Solid-State Electronics 49 (2005) 1813-1819, which is incorporated by reference herein.

FIGS. 2A, 2B, and 3-12 illustrate stages in fabrication of an array of programmable memory cells according to an embodiment.

Figure 2A:
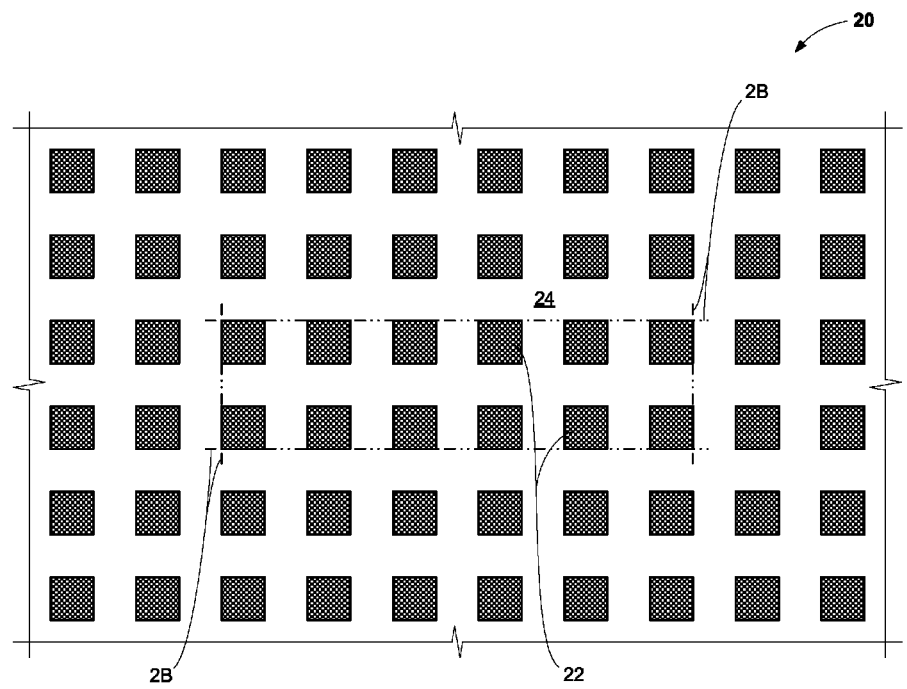
FIG. 2A is a diagrammatic sketch in a plan view showing an array of first electrodes.
Figure 2B:
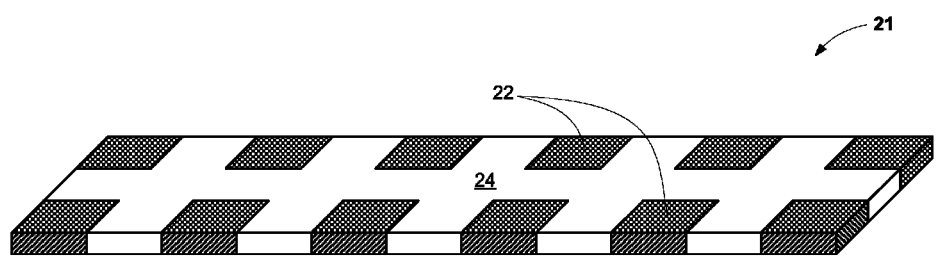
FIG. 2B is a diagrammatic sketch in a three-dimensional view showing a portion of an array of first electrodes as in FIG. 2A.

FIG. 2A shows in a diagrammatic plan view a portion 20 of an array of bottom electrodes 22 exposed at the surface of a dielectric support 24. FIG. 2B shows a segment 21 of such an array, demarcated by broken lines 2B in FIG. 2A. The segment 21 includes six rows of two bottom electrodes, and two columns of six bottom electrodes. As will be appreciated, the bottom electrodes 22 are electrically coupled to access devices formed in the underlying substrate (not shown in these Figures); the access devices coupled to the bottom electrodes in each row are coupled to a word line, and (as described further below) the memory cells in each column are couples to a bit line. Suitable materials for the bottom electrodes 22 include conductive materials such as a metal or metal-based material or a non-metal material, such as, e.g.: copper; aluminum; titanium (Ti) and titanium-based materials such as titanium nitride (TiN), titanium ox nitride (TON); tantalum (Ta) and tantalum-based materials such as tantalum nitride (TaN); polysilicon, tungsten-based materials such as tungsten silicide ($WSi_x$); and, for a low thermal conductivity electrode, materials such as LNO (LaNiO3) and LSMO (LaSr $MnO_3$). Suitable materials for the dielectric support 24 include, for example, materials employed as intermetallic dielectrics, and include oxides (such as, e.g., silicon dioxide). The upper surface of the bottom electrode array is planarized, for example by a CMP technique. The bottom electrodes may have a thickness, for example, in a range about 1 nm to about 100 nm, more usually about 10 nm to about 50 nm, and in particular examples about 20 nm.

Figure 3:
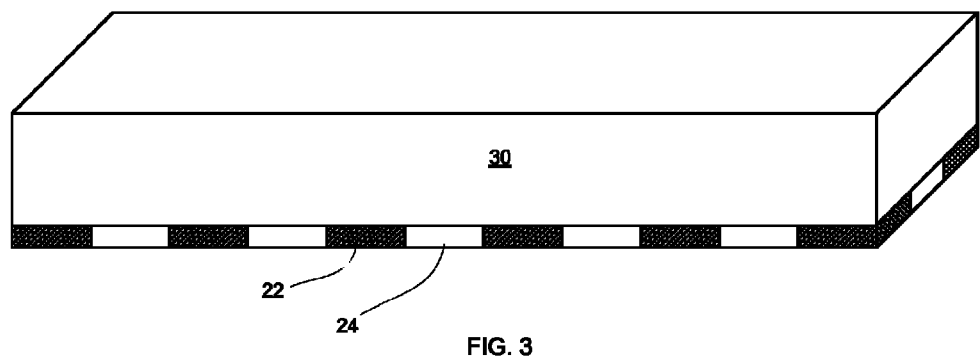
FIGS. 3-12 are diagrammatic sketches in three-dimensional view showing stages in a process for making a phase change memory array according to an embodiment.
Figure 4:
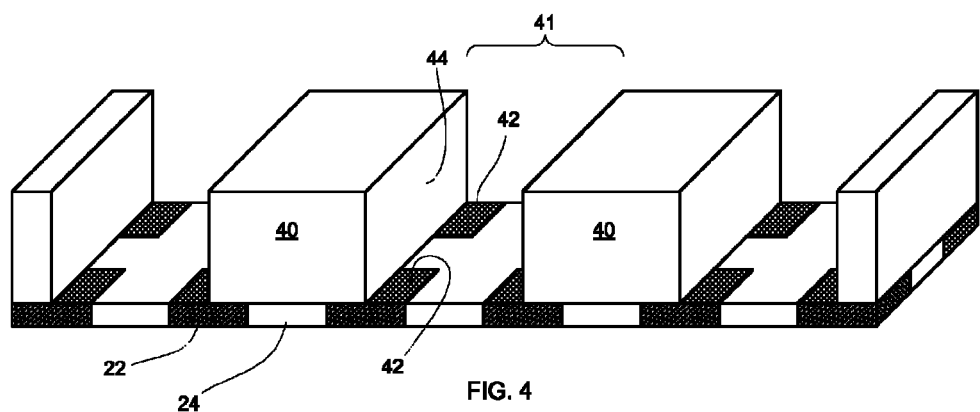

FIG. 3 shows a dielectric support layer 30 formed over the surface of the bottom electrode array. Suitable materials for the dielectric support layer include, for example, oxides (e.g., silicon oxides, such as $SiO_2$) and nitrides (e.g., silicon nitrides, such as SiN); low-K dielectric materials (such as a doped $SiO_2$, for example) may be preferred; and materials having low thermal conductivity may be preferred. The dielectric support layer can be formed by, for example, a physical vapor deposition (PVD) process, or a chemical vapor deposition (CVD) process. The thickness of the dielectric support layer as measured between from the upper surface to the underlying bottom electrode array surface is related to the eventual height of the L-shaped memory material element, as described further below.

Thereafter cavities are formed in the dielectric support layer. The cavities expose areas of the underlying bottom electrode array, and define dielectric support structures having sidewalls. In the example shown in FIG. 4, the cavities are trenches 41 running parallel to the word lines in the access circuitry beneath the bottom electrode array. The dielectric support structures 40 defined by the trenches 41 have generally vertical sidewalls 44. The trenches are arranged so that regions 42 of bottom electrodes 22 are exposed adjacent the sidewalls 44; and, in the example shown, the trenches are arranged and dimensioned so that regions 42 of bottom electrodes 22 are exposed adjacent the sidewalls 44 along both sides of each trench.

The cavities are formed by, for example, a patterned etch such as a photolithography technique, or a reactive ion etch (RIE) technique. Where RIE is employed, it may be followed by a cleaning process. A suitable technique results in substantially planar, approximately vertical sidewalls, and may be carried out in two or more steps.

Figure 5:
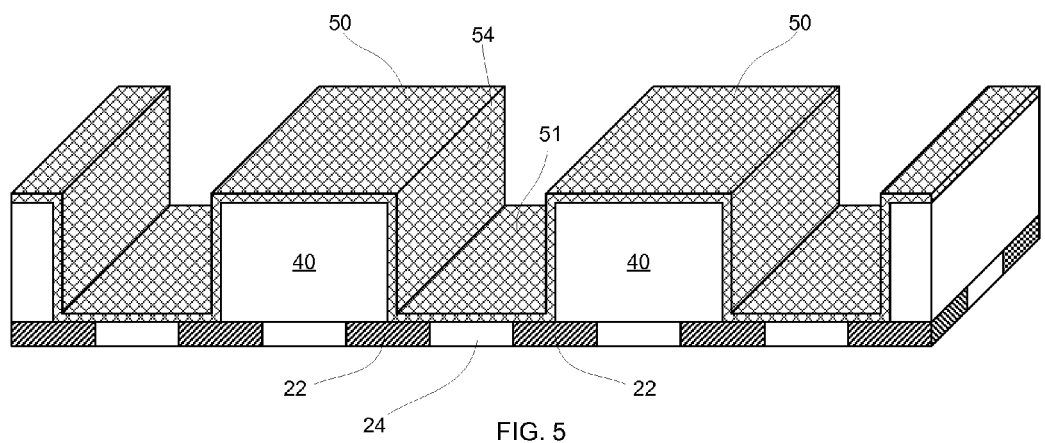

Thereafter a film of the memory material is formed over the upper surfaces and sidewalls of the dielectric support structures, and over the exposed areas of the bottom electrode array surface. A resulting structure is shown in FIG. 5, in which the memory material film conformally covers, at 50, the upper surfaces and, at 54, the sidewalls, of the dielectric support structures 40; and conformally covers, at 51, the exposed areas of the bottom electrode array. As a result the memory material film contacts the exposed regions 42 of the bottom electrodes 22.

In the example shown, a chalcogenide material is employed. The chalcogenide material film may be formed by vapor deposition, such as physical vapor deposition (PVD) or chemical vapor deposition (CVD), for example.

An example of a method for forming a chalcogenide material film uses a PVD-sputtering or magnetron-sputtering method with source gas(es) of Ar, $N_2$, and/or He, etc. at the pressure in the range 1 mTorr~100 mTorr. The deposition is usually done at room temperature. A collimator with an aspect ratio of 1~5 can be used to improve the fill-in performance. To improve conformity with the surfaces, a DC bias of several tens of volts to several hundreds of volts may also be used. On the other hand, the combination of DC bias and the collimater can be used simultaneously.

Another example of a method for forming a chalcogenide material film uses CVD such as that disclosed in U.S. Patent Application Publication No. 2006/0172067, titled "Chemical Vapor Deposition of Chalcogenide Materials", which is incorporated by reference herein.

A post-deposition annealing treatment in a vacuum or in an $N_2$ ambient is optionally performed to improve the crystalline state of chalcogenide material. The annealing temperature typically ranges from 100° C. to 400° C. with an anneal time of less than 30 minutes.

The memory material film can be formed to a thickness in a range about 1 nm to about 50 nm, more usually about 5 nm to about 15 nm, and in particular examples about 8 nm. With reference to FIGS. 1B and 1D, the thickness of the memory film at 54, on the sidewalls, establishes the eventual thickness ($t_{mv}$) of the fin-shaped upright portion 17 of the memory material element; and the thickness of the memory film at 51, overlying the exposed areas 42 of the surfaces of the bottom electrodes 22, establishes the eventual thickness ($t_{mh}$) of the base portion 15 of the memory material element. As will be appreciated, because the memory film conforms to the substantially planar sidewalls of the dielectric support structures, the fin-shaped upright portion of the memory material element is also substantially planar, and may be referred to as planar herein.

Figure 6:
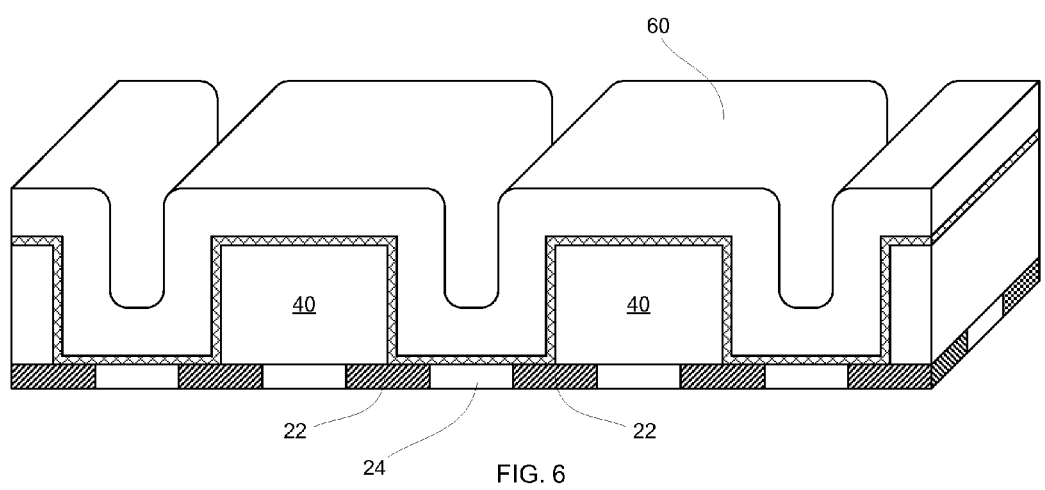

After formation of the memory material film, a dielectric sidewall spacer layer is formed over the memory material film. A resulting structure is shown in FIG. 6, in which the dielectric sidewall spacer layer 60 covers the memory material film. Suitable materials for the dielectric sidewall spacer layer include, for example, a layer of oxide such as a silicon oxide (e.g., $SiO_2$), or a nitride such as a silicon nitride (e.g., SiN); low-K dielectric materials (such as a doped $SiO_2$, for example) may be preferred. Preferred materials react only to a low extent or do not react with the memory material film; and preferred materials adhere well to the memory material film. Where the film is a GST-type phase change memory material, for example, a preferred sidewall spacer material may be SiN. The dielectric sidewall spacer layer can be formed by, for example, a vapor deposition process such as a chemical vapor deposition (CVD), or an atomic layer chemical vapor deposition (ALCVD), or an atomic layer deposition (ALD). The dielectric sidewall spacer layer can be formed to a thickness in a range about 1 nm to about 100 nm, more usually about 5 nm to about 30 nm, and in particular examples about 15 nm.

Thereafter dielectric sidewall spacers are formed, and a memory material structure is formed having generally horizontal portions underlying the dielectric sidewall spacers (that is, between the dielectric sidewall spacers and the electrode array surface), and generally vertical portions between the dielectric sidewall spacers and the sidewalls of the dielectric support structures. Stated another way, the resulting memory material structure is L-shaped in a sectional view taken generally across the trenches.

Figure 7:
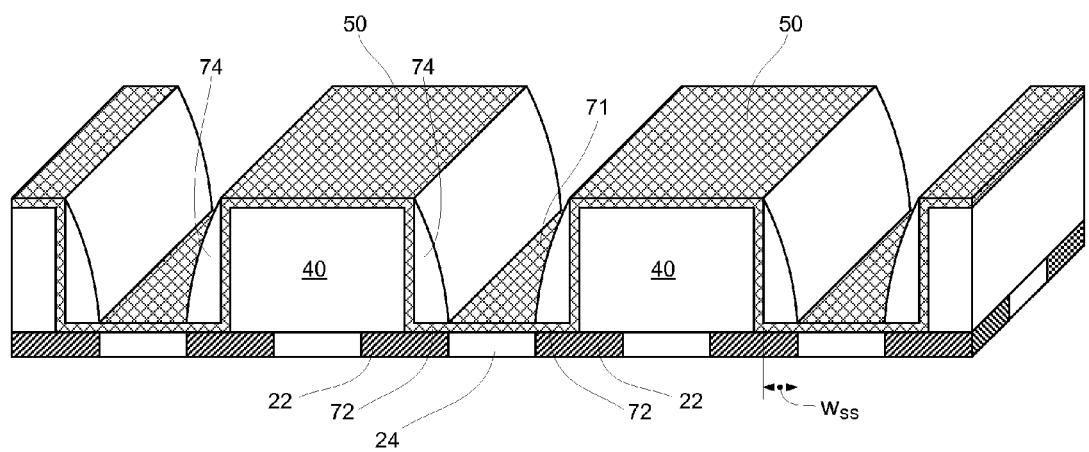

The dielectric sidewall spacers are formed by anisotropically etching the dielectric sidewall spacer 60 down to the memory material film. Suitable anisotropic etch techniques for formation of dielectric sidewall spacers include, for example, a directional plasma etch, for example a reactive ion etch (RIE). A resulting structure is shown in FIG. 7, showing dielectric sidewall spacers 74 in the inner angles defined at the intersection of the memory material film 54 on the sidewalls 44 of the dielectric support structures 40 and the memory material film 51 on the exposed areas of the bottom electrode array. The dielectric sidewall spacer has a width ($w_{ss}$) at the bottom electrode array. The width ($w_{ss}$) depends upon, among other factors, the thickness of the dielectric sidewall spacer layer; additionally, the width of the dielectric sidewall spacers can be controlled by selecting etch parameters (power, pressure, reaction chemistry) according to the particular material being etched.

It may be preferred to minimize the width of the generally horizontal portions 85 of the memory material structures, as the feature of importance to the performance of the device is the upright portion 87.

The anisotropic etch of the dielectric sidewall spacer layer 60 exposes areas of the memory material film at 50, the upper surfaces of the dielectric support structures 40, and at 71 over areas of the bottom electrode array surface not overlain by the sidewall spacers 74. This anisotropic etch may be continued through the exposed areas of the memory film; or, the exposed areas of the memory material film may be removed by a subsequent etching step. Where the memory material is a GST-type phase change material, for example, it may be preferred to avoid use of Chlorine-based etch chemistry for removal of exposed areas of the memory material film.

Figure 8:
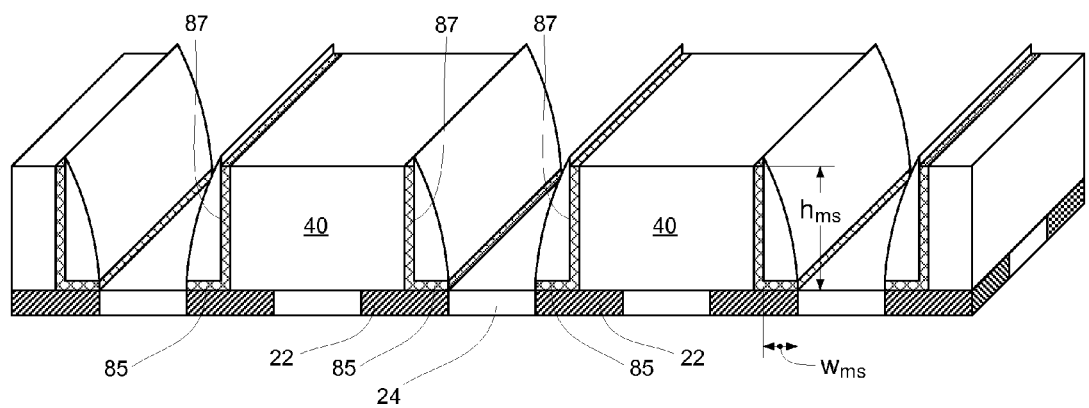

A resulting structure is shown in FIG. 8. As noted above, at this stage what remain of the memory material film are memory material structures having generally horizontal portions 85 underlying the dielectric sidewall spacers and generally vertical portions 87 between the dielectric sidewall spacers and the sidewalls of the dielectric support structures. The height ($h_{ms}$) of the vertical portions 87 at this stage is approximately equal to the height of the dielectric support structures 40; and the width ($w_{ms}$) of the generally horizontal portions 85 at this stage is approximately equal to the widths ($w_{ss}$) of the dielectric sidewall spacers 74.

Figure 9:
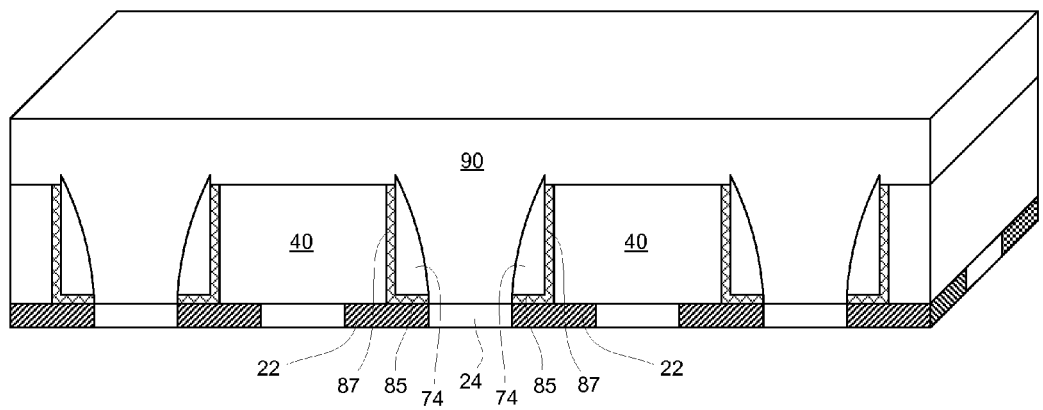

Thereafter a dielectric fill is formed in the trenches and over the structure of FIG. 8, as shown at 90 is FIG. 9. Suitable materials for the dielectric fill include, for example, oxides such as silicon oxides, or nitrides such as silicon nitrides; low-K dielectrics may be preferred. The dielectric fill can be formed by, for example, deposition of a suitable fill material.

Figure 10:
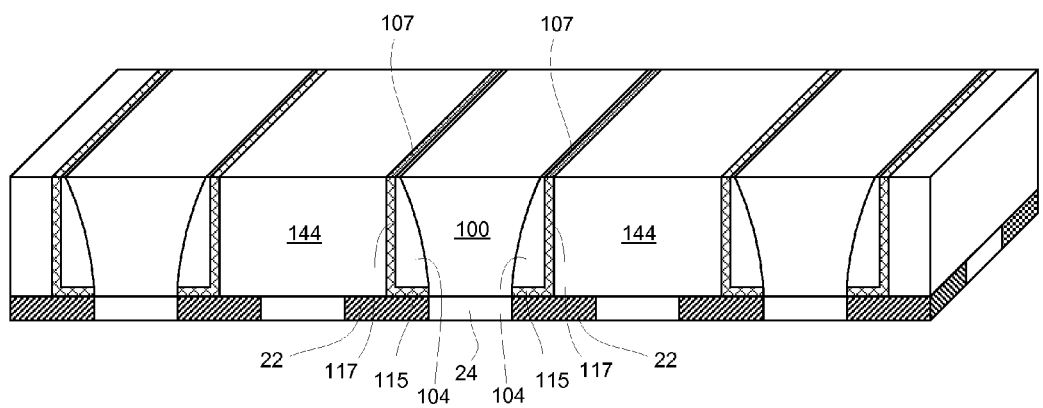

Thereafter the structure of FIG. 9 is planarized by, for example CMP, to form a structure as shown in FIG. 10. The height of the features in the resulting planarized structure (including dielectric support structures 144, dielectric fills 100, dielectric sidewall spacers 104, and the vertical portions 117 of the memory material structures 115, 117) may as a result of the polish be less than the height ($h_{ms}$) of the dielectric support structures 40 prior to planarization. Planarization exposes upper surfaces of the dielectric support structures 144, of the dielectric fills 100, truncated upper edges of the dielectric sidewall spacers 104, and surfaces 107 of the upper ends of the vertical portions 117 of the memory material structures. The planarization has no effect on the width ($w_{ms}$) of the generally horizontal portions 115 of the memory material structures.

Because the surfaces 107 of the upper ends of the vertical portions 117 of the memory material structures are formed as a result of planarization of the filled structure of FIG. 9, the contact surfaces 107 are generally planar, and lie in a plane generally parallel to the plane of the bottom electrodes, and transverse to the vertical portions 117 of the L-shaped memory material structures.

Figure 11:
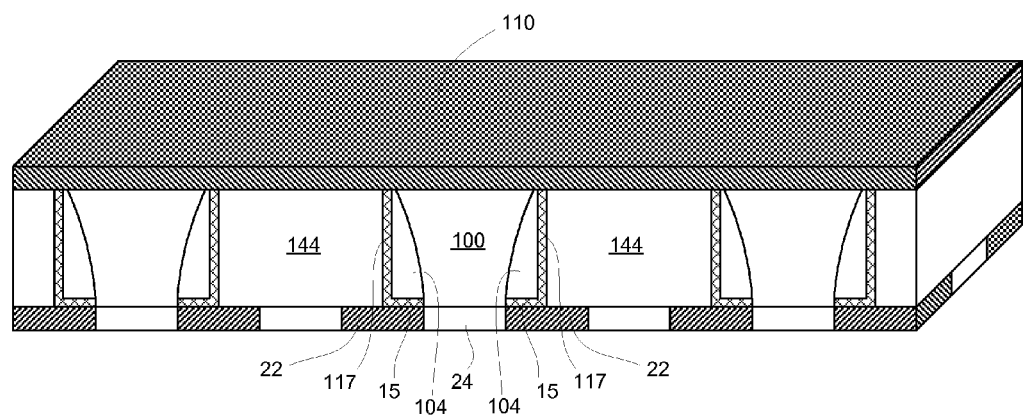

Thereafter a top electrode material layer is formed over the planarized surface of the structure of FIG. 10, as shown at 110 in FIG. 11. Suitable materials for the top electrode layer include conductive materials such as a metal or metal-based material or a non-metal material, such as, e.g.: copper; aluminum; titanium (Ti) and titanium-based materials such as titanium nitride (TiN), titanium ox nitride (TON); tantalum (Ta) and tantalum-based materials such as tantalum nitride (TaN); polysilicon, tungsten-based materials such as tungsten silicide ($WSi_x$); and, for a low thermal conductivity electrode, materials such as LNO (LaNiO3) and LSMO ($LaSrMnO_3$). The top electrode layer may be formed by any of a variety of techniques suited to the particular material. Such techniques include, by way of example, sputtering and plating and CVD.

Thereafter the top electrode material is patterned to form top electrodes over the memory cells. The top electrodes may be patterned to form islands; or, as in the example shown in FIG. 12, they may be formed as straplines or bitlines 114, generally perpendicular to the underlying word lines. The top electrode may have a thickness, for example, in a range about 200 Å to about 5000 Å, usually about 2000 Å. The patterned top electrodes contact the upper surfaces 107 (see, e.g., FIG. 10) of the memory material structures 115, 117, establishing a current path running through the fin-shaped memory material element between the lower and upper electrodes.

Figure 12:
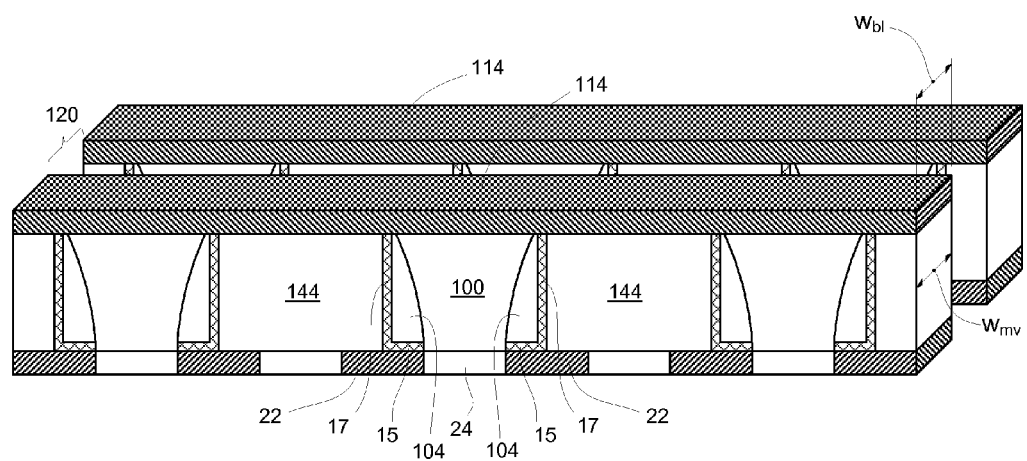

Additionally, trenches, e.g., trench 120, are formed perpendicular to the underlying word lines and between the top electrodes to separate the columns of memory cells. The trench is formed to a depth sufficient to cut through the memory material structures, resulting in separate columns of individual memory material elements. The trench may stop at the bottom electrode layer; or, as shown in FIG. 12, the trench may go through the bottom electrode layer as well. In any event the trench must not pass through the underlying word lines.

The top electrodes may be patterned by, for example, an etch (by, for example, a photolithography technique) prior to forming the trenches. Or where, as here, the top electrodes are formed as straplines or bitlines, the top electrodes may be patterned as part of the trench formation. Where the top electrodes are patterned as part of the trench formation (using the same mask), the top electrodes are self-aligned with the memory material structures.

Suitable techniques for forming the trench include, for example, a directional etch such as, for example an RIE. The RIE may be controlled by selection of process parameters; employing lower pressure and higher substrate bias may provide better control of the shape and dimensions of the trench. A double-patterning or manifold patterning lithographic technique may be employed; examples of such techniques are outlined in Ping Xie et al. (2009) "Analysis of higher-order pitch division for sub-32 nm lithography", *Proc. of SPIE, Vol.* 7274, pp. 72741Y-1 through 72741Y-8.

Figure 13:
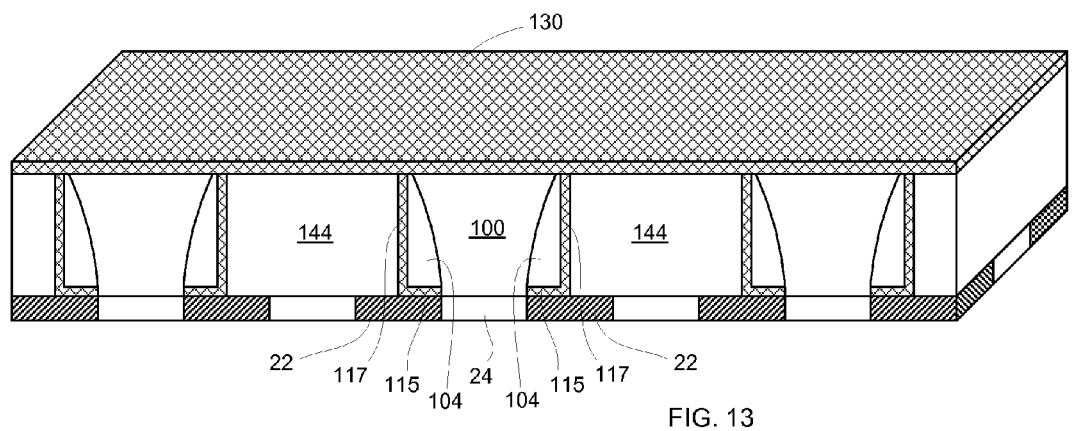
FIGS. 13-15 are diagrammatic sketches in three-dimensional view showing stages in a process for making a phase change memory array according to another embodiment.
Figure 14:
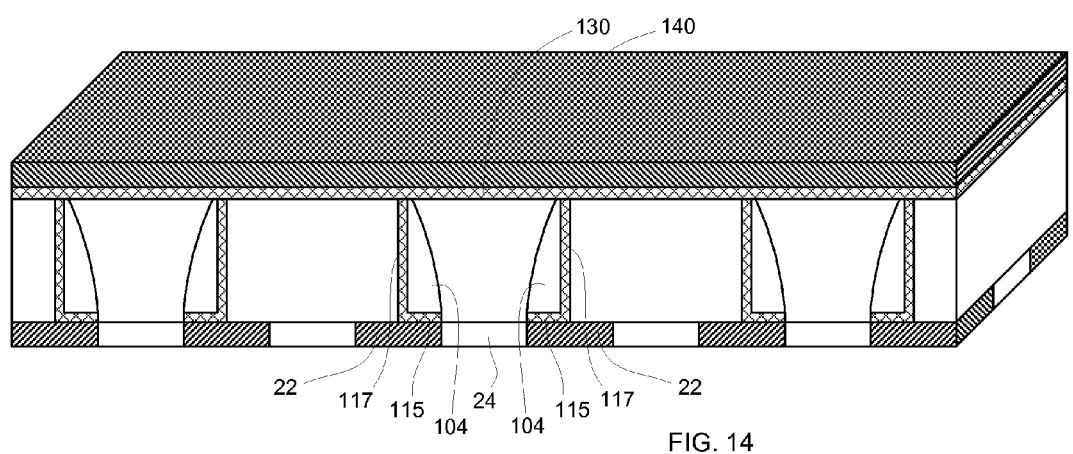
Figure 15:
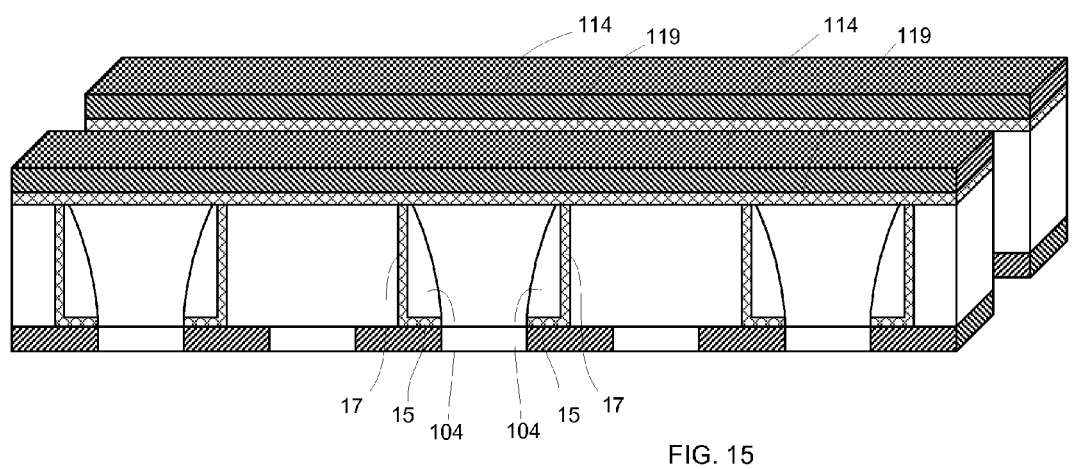

Alternatively, a layer of a memory material may be interposed between the planarized surface of the structure of FIG. 10 and the top electrode layer, as illustrated for example in FIGS. 13-15. prior to forming the upper electrode layer, a layer 130 of a memory material is formed over the surface of the structure of FIG. 10. The memory material of layer 130 may be any of the variety of memory materials outlined above. The memory material of layer 130 may the same materials as, or the same type of material as, the memory material of the memory material structures 115, 117. Thereafter, a top electrode material layer 140 is formed as described above over the memory material layer 130, as shown in FIG. 14.

Thereafter the top electrode material is patterned to form top electrodes over the memory cells. The top electrodes may be patterned to form islands; or, as in the example shown in FIG. 15, they may be formed as straplines or bitlines 114, generally perpendicular to the underlying word lines. The top electrode may have a thickness, for example, in a range about 200 Å to about 5000 Å, usually about 2000 Å.

Additionally, trenches, e.g., trench 120, are formed perpendicular to the underlying word lines and between the top electrodes and the memory material layer 130 to separate the columns of memory cells. The trench passes through the memory material layer, resulting in lines of memory material 119 underlying the top electrodes 114, as shown in FIG. 15. The trench is formed to a depth sufficient to cut through the memory material structures, resulting in separate columns of individual memory material elements. The trench may stop at the bottom electrode layer; or, as shown in FIG. 15, the trench may go through the bottom electrode layer as well. In any event the trench must not pass through the underlying word lines.

The top electrodes may be patterned by, for example, an etch (by, for example, a photolithography technique) prior to forming the trenches. Or where, as here, the top electrodes are formed as straplines or bitlines, the top electrodes may be patterned as part of the trench formation and, as noted above, where the top electrodes are patterned as part of the trench formation (using the same mask), the top electrodes are self-aligned with the memory material structures. Examples of suitable techniques for patterning the top electrodes and for forming the trenches, are outlined above.

Depending upon the selected technique for patterning the top electrodes and forming the trenches, the widths of the top electrodes may be the same as, or greater or less than, the width of the memory elements underlying it. Where, for example, the top electrodes and the underlying memory elements are self-aligned, and where the etch is highly directional, the widths of the top electrodes and of the underlying memory elements are the same. Or, for example, the etch process may be modified to provide a controlled degree of undercut of the underlying memory material, resulting in the memory elements being narrower than the top electrodes. Or, for example, the top electrodes may be made narrower than the underlying memory elements, either (for example) by employing different masks for patterning the top electrodes and forming the trenches or (for example) by narrowing the top electrodes in a subsequent procedure.

Referring for example to FIG. 1B and to FIG. 12, where the width ($w_{bl}$) of the top electrode 114 is equal to or is greater than the width ($w_{mv}$) of the upright portion 17 of the underlying memory element, the area of contact between the upright portion 17 of the memory element and the upper electrode 14 (114) is the area of the contact surface 18. That is, the contact area is the product of the thickness ($t_{mv}$) and the width ($w_{mv}$) of the upright portion 17 of the memory material element). Where, on the other hand, the width ($w_{bl}$) of the top electrode 114 is less than the width ($w_{mv}$) of the upright portion 17 of the underlying memory element, the area of contact between the upright portion 17 of the memory element and the upper electrode 14 (114) is the product of the thickness ($t_{mv}$) of the upright portion 17 of the memory element and the width ($w_{bl}$) of the top electrode 14 (114). These dimensions can be closely determined by controlling the parameters (etch chemistry, power, pressure, bias, etc.) of the etch process(es).

Following separation of the columns of memory elements, a dielectric fill (not shown in the Figures) is deposited in the trenches and over the top electrodes.

Figure 16:
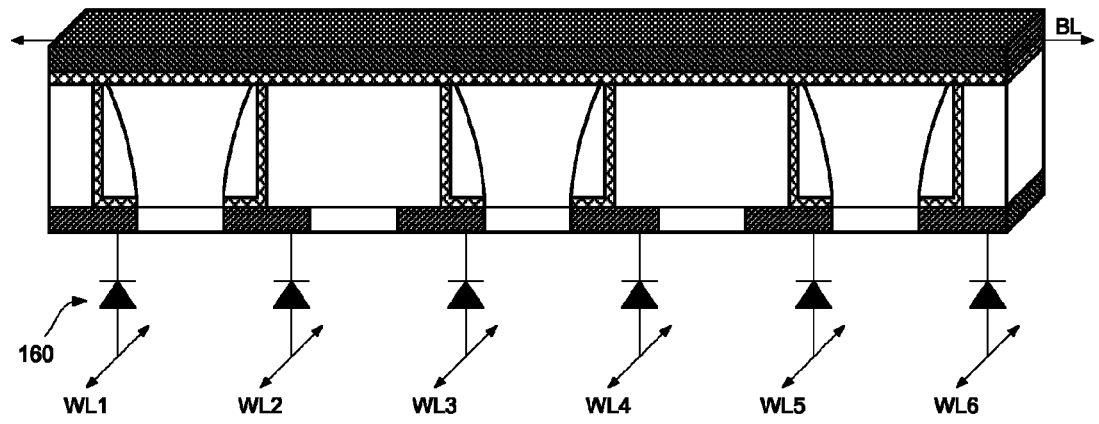
FIGS. 16-18 are diagrammatic sketches in three-dimensional view showing phase change memory arrays according to other embodiments.
Figure 17:
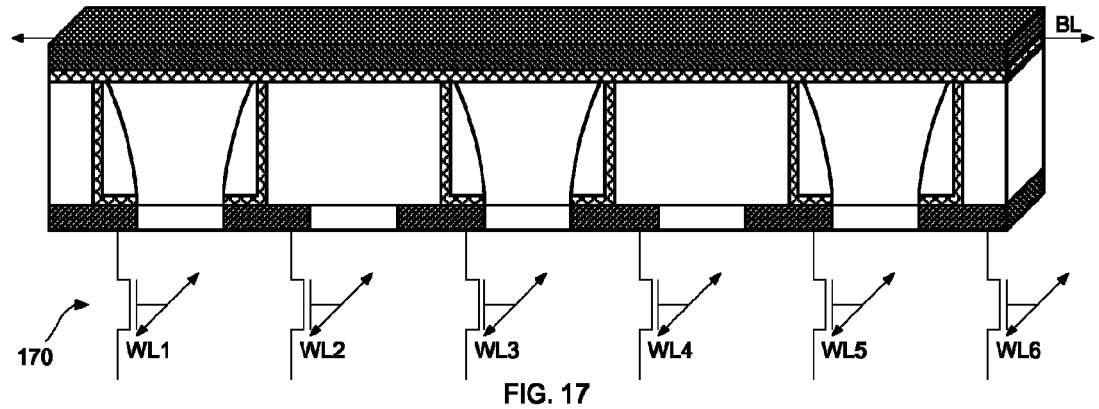
Figure 18:
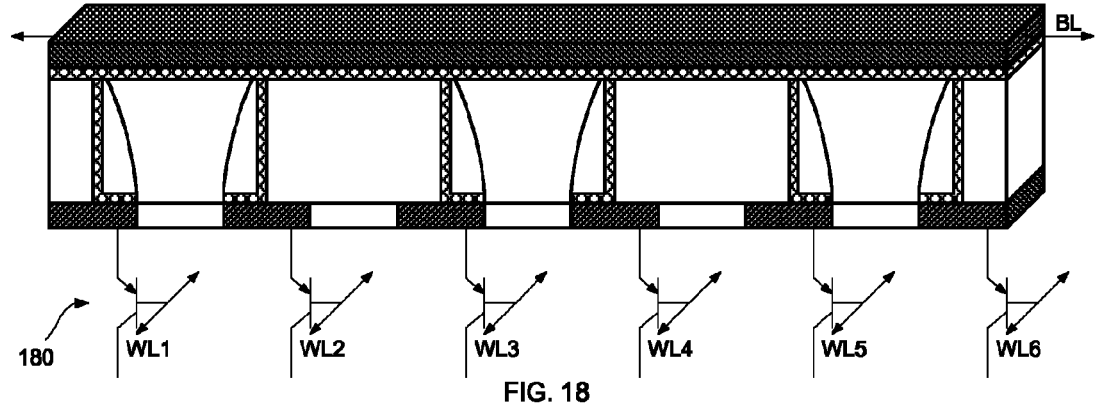

As noted above, any of various types of access devices may be employed, as illustrated symbolically in FIGS. 16-18. Each of these Figures shows a portion of a column of memory cells electrically coupled to a top electrode that constitutes a bit line. The access devices 160 in FIG. 16 are diodes; the access devices 170 in FIG. 17 are field effect transistors; the access devices 180 in FIG. 18 are bipolar junction transistors. Various configurations for access circuitry are known, along with methods for fabricating them, and others are contemplated. Examples include vertical silicon-based drives.

Figure 21A:
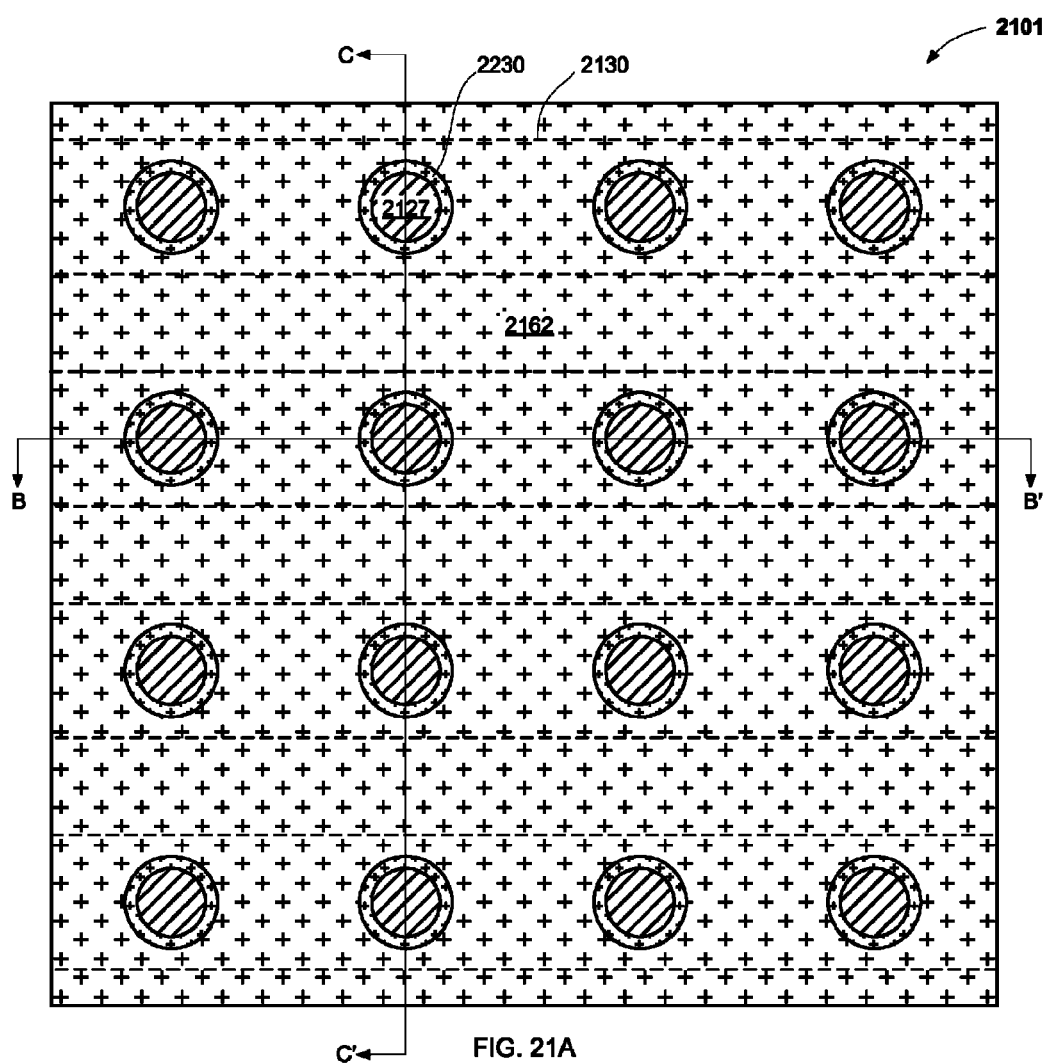
FIGS. 21A, 21B, 21C are diagrammatic sketches showing an example of an array of access devices for use in a memory array according to an embodiment.
Figure 21B:
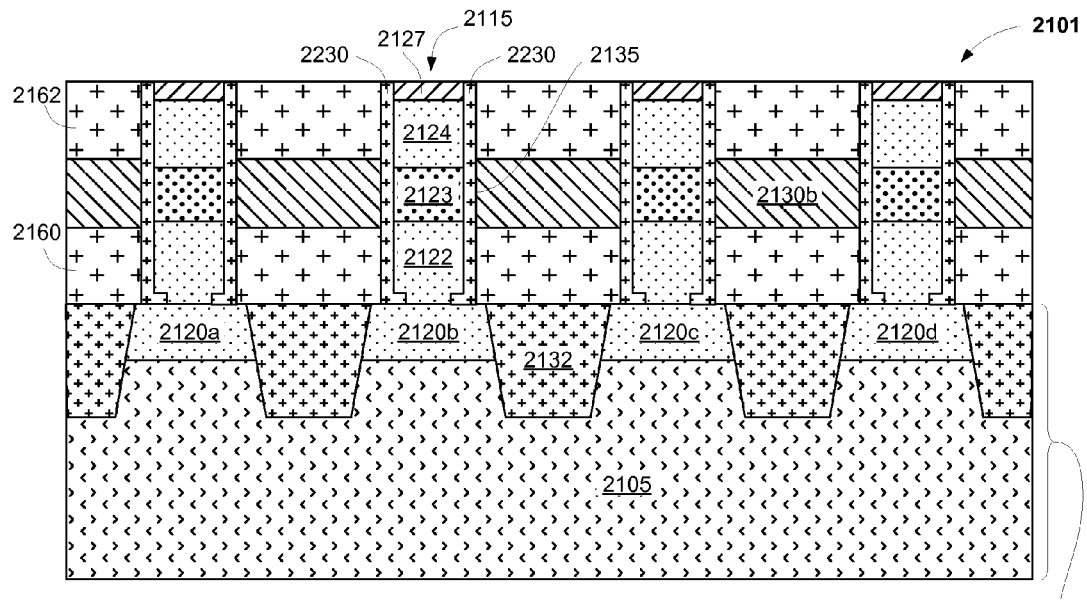
Figure 21C:
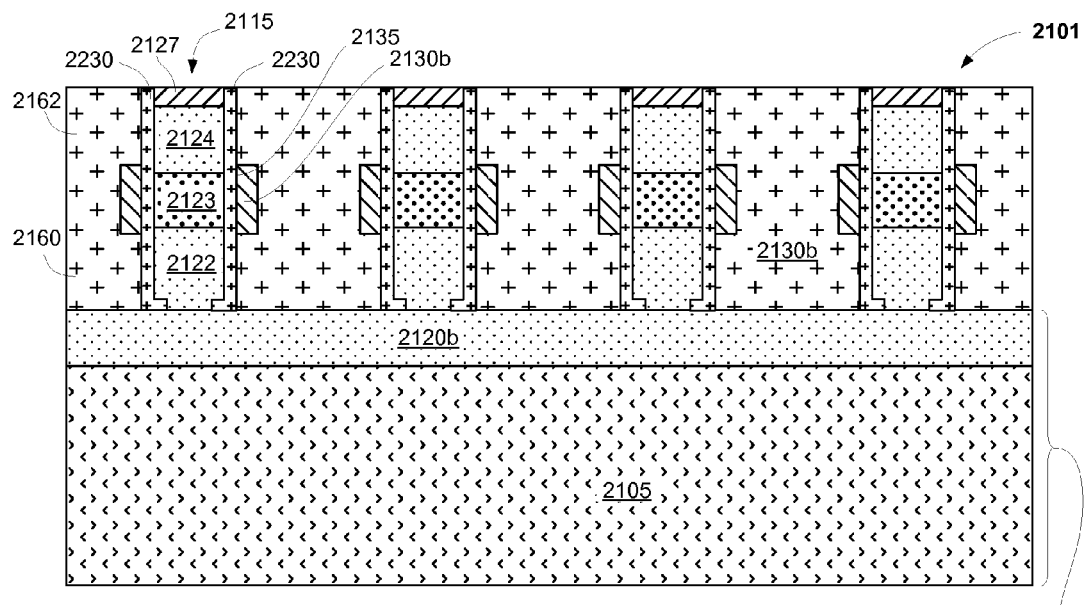

FIGS. 21A, 21B, 21C illustrate an example of access devices that may suitably employed. FIG. 21A is a plan view of a portion of the access device array, FIG. 21B is a section thru a portion of the array at B-B' in FIG. 1A, taken along a word line 2130; and FIG. 21C is a section thru a portion of the array at C-C' in FIG. 1A, taken along a bit line 2120.

The access device array 2101 includes a single-crystalline substrate 2100 comprising a well 2105 having a first conductivity type and conductive lines 2120 (2120a, 2120b, 2120c, 2120d) (which may constitute bit lines) within the well 2105. The conductive lines 2120 extend in a first direction into out of the sectional view of FIG. 21B and are separated by dielectric trench isolation structures 2132 within the well 2105. The conductive lines 2120 comprise doped substrate material having a second conductivity type opposite that of the first conductivity type. In the illustrated example the doped substrate material of the conductive lines 2120 comprises high doped N-type (N+) material of the substrate 2100, and the well 2105 comprises doped P-type material of the substrate 2100.

The field effect transistor 2115 of the access device includes a first terminal 2122 comprising doped semiconductor material on the corresponding conductive line 2120b, a channel region 2123 comprising doped semiconductor material on the first terminal 2122, and a second terminal 2124 comprising doped semiconductor material on the channel region 2123.

A conductive cap 2127 comprising silicide is on the second terminal 2124. The conductive cap 2127 may comprise, for example, a silicide containing Ti, W, Co, Ni, or Ta. The conductive cap 2127 provides a low resistance contact between the doped semiconductor material of the second terminal 2126 and an electrode 22 in the overlying electrode array (not shown in these Figures; see electrodes 22 in FIGS. 2A, 2B).

In the illustrated embodiment the first and second terminals 2122, 2124 comprise highly doped N-type material, and the channel region 2123 comprises doped P-type material.

The first and second terminals 2122, 2124, the channel region 2123, and the conductive cap 2127 form a stack which is surrounded by a dielectric 2230, the dielectric 2230 separating the channel region 2123 from the corresponding word line 2130b.

The word lines 2130, including word line 2130b acting as the gate of the field effect transistor 2115 of the access device, extend into and out of the sectional view of FIG. 21C and comprise doped polysilicon material and a silicide layer on the doped polysilicon. The stack formed by the first and second terminals 2122, 2124, the channel region 2123, and the conductive cap 2127 extends through a via in the word line 2130b to electrically couple the conductive line 2120b to an overlying electrode, the via in the word line 2130b having a sidewall surface 2135 surrounding the channel region 2123.

Construction of such an access array is described, for example, in U.S. application Ser. No. 12/471,287, filed May 22, 2009.

The memory cell array is formed over the access device array shown in FIGS. 21A, 21B, 21C. In some embodiments the conductive cap 2127 may itself constitute the bottom electrode of the memory cell that is formed over it. Or, an overlying electrode layer (not shown in these Figures; see FIGS. 2A, 2B) may be provided, including electrodes 22 formed in contact with the conductive caps 2127 and extending through a dielectric 24 to the memory element.

Operation of the programmable memory cell will be described by way of example with reference to FIGS. 1C, 1D and FIGS. 21B, 21C. In operation, a common voltage coupled to the conductive material (top electrode) 14 and voltages supplied to the word line 2130b and the conductive (bit) line 2120b can induce current to flow from the conductive line 2120b to the conductive material 14, or vice versa, by way of the first terminal 2122, channel region 2123, second terminal 2124, conductive cap 2127, bottom electrode 12, memory material element 15, 17 and memory material layer 19.

Figure 22A:
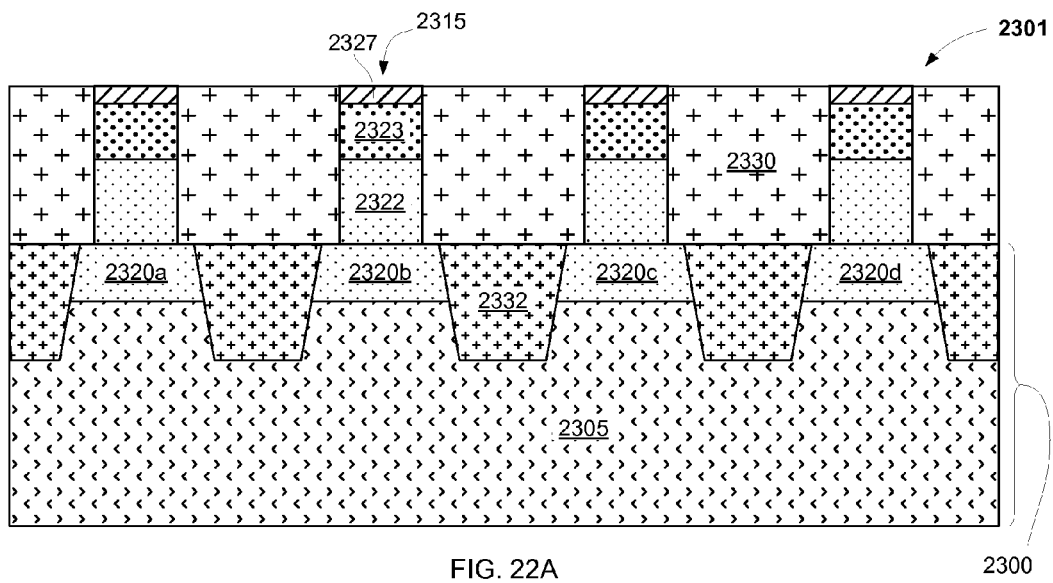
FIGS. 22A, 22B are diagrammatic sketches in sectional view showing an example of an array of access devices for use in a memory array according to another embodiment.
Figure 22B:
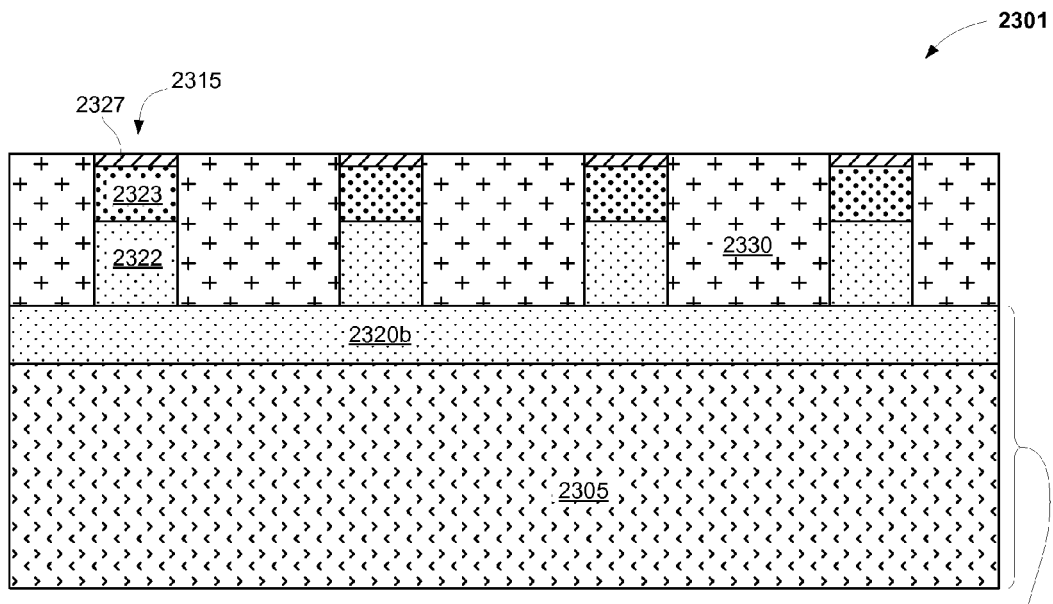

FIGS. 22A, 22B illustrate another example of access devices that may suitably employed. FIG. 22A is a section thru a portion of the array, taken perpendicular to a bit line 2320; and FIG. 22B is a section thru a portion of the array, taken along a bit line 2320.

The access device array 2301 includes a single-crystalline substrate 2300 comprising a well 2305 having a first conductivity type and conductive lines 2320 (2320a, 2320b, 2320c, 2320d) (which may constitute bit lines) within the well 2305. The conductive lines 2320 extend in a first direction into out of the sectional view of FIG. 22A and are separated by dielectric trench isolation structures 2332 within the well 2305. The conductive lines 2320 comprise doped substrate material having a second conductivity type opposite that of the first conductivity type. In the illustrated example the doped substrate material of the conductive lines 2320 comprises high doped N-type (N+) material of the substrate 2300, and the well 2305 comprises doped P-type material of the substrate 2300. Access devices 2315 extend upwardly from the corresponding conductive lines, within vias surrounded by dielectric fill material 2330. Each access device 2315 includes, successively from the conductive lines 2320 upward, a lightly doped layer of N material (the N− layer) 2322, a layer of heavily doped P material (the P+ layer) 2323, and a conductive cap 2327.

Construction of such an access array is described, for example, in U.S. application Ser. No. 12/060,075, filed Mar. 31, 2008, published Oct. 1, 2009 at US-2009-0242865-A1.

The memory cell array is formed over the access device array shown in FIGS. 22A, 22B. In some embodiments the conductive cap 2327 may itself constitute the bottom electrode of the memory cell that is formed over it. Or, an overlying electrode layer (not shown in these Figures; see FIGS. 2A, 2B) may be provided, including electrodes 22 formed in contact with the conductive caps 2327 and extending through a dielectric 24 to the memory element.

It will be noted that in the example shown in FIGS. 21A, 21B, 21C the structure defines a transistor; and in FIGS. 22A, 22B the N− and P+ layers define a diode. In the examples of each type the structure is constructed vertically, and can be fabricated to a high device density.

It will be noted that the drawings depict a portion of an array, showing four adjacent elements in a row or column of a 4×4 portion of an array. The various elements are shown without the components required to connect them to other circuitry within or without the semiconductor chip in which they are embedded. Those in the art will understand that the array may be scaled up to several billion elements or more.

The active region of the memory element, in which the memory material is induced to change between at least two solid phases, is located within the upright portion 17. As can be appreciated, the active region can be made extremely small in the illustrated structure, thus reducing the magnitude of current needed to induce a phase change. The thickness $t_{mv}$ of the memory material 17 can be established using thin film deposition techniques, as described above. Moreover, because the width $w_{mv}$ of the memory material fin 17 is formed using the same mask as is used to pattern the top electrode (that is, the top electrode and the memory material fin width are "self-aligned"), the width $w_{mv}$ can be made less than that of the top electrode 14, and preferably less than a minimum feature size for a process, typically a lithographic process, used to form the top electrodes. With reference again to FIGS. 1C, 1D, the resulting memory material fin 17 has a thin and narrow cross-sectional area, and a correspondingly thin and narrow top surface 18 contacting the memory material layer 19. The small sectional area and top surface of the memory material fin 17 concentrates current density, thereby reducing the magnitude of the current needed to induce a phase change in the active region. Additionally, the dielectric adjacent the fin may provide some thermal isolation to the active region, which also helps to reduce the amount of current necessary to induce a phase change.

Other embodiments are within the claims.

We claim:

1. A memory array comprising an array of memory cells including top electrodes having first contact surfaces extending in a first direction, bottom electrodes having second contact surfaces, and memory material elements electrically coupled to the bottom and top electrodes, the memory material elements having a generally horizontal base portion and a planar upright portion; wherein:
   each pair of adjacent memory cells in the array includes the memory material elements having mirror image shapes with respect to each other in the first direction;
   the planar upright portion of the memory material element is confined within dielectric materials on one side of the planar upright portion and on an opposite side of the planar upright portion: and
   each of the bottom electrodes overlies and connects to a corresponding access device of an array of access devices;
   wherein a horizontal memory material layer underlies and is in contact with the top electrodes, and an upper end of the upright portion of the memory material element is in contact with the horizontal memory material layer of the respective top electrode.

2. The memory array of claim 1 wherein a lower surface of the base portion of the memory material element is in contact with the second contact surface of the respective bottom electrode.

3. The memory array of claim 1 wherein an upper end of the upright portion of the memory material element is in contact with the first contact surface of the respective top electrode.

4. The memory array of claim 1 wherein the memory material element comprises a programmable resistance material.

5. The memory array of claim 4 wherein the programmable resistance material includes a phase change memory material.

6. The memory array of claim 5 wherein the phase change memory material comprises a chalcogenide based material.

7. The memory array of claim 5 wherein the phase change memory material comprises a Ge—Sb—Te ("GST") alloy.

8. The memory array of claim 1 wherein the upright portion of the memory material element and the respective top electrode are self-aligned with a same mask used in a manufacturing process for the memory array.

9. The memory array of claim 1, wherein the access devices are electrically coupled to word lines, and the top electrodes are electrically coupled to or constitute bit lines in the first direction.

10. The memory array of claim 1 wherein the memory material elements of each pair of adjacent memory cells in the array have shapes that are not identical with respect to each other in the first direction.

11. A memory device comprising an array of memory cells, each memory cell comprising:

first and second electrodes overlying an access device, the first electrode having a first contact surface;

a memory element electrically coupled to the first and second electrodes;

said memory element being located on first and second planar surfaces, wherein:

said first planar surface is substantially perpendicular to said second planar surface and the memory element has a conformal shape along said first and second planar surfaces;

the first planar surface of the memory element is confined within dielectric materials on one side of the first planar surface and on an opposite side of the first planar surface; and the conformal shapes of each pair of adjacent memory cells in the array are mirror images with respect to each other in a first direction;

wherein a horizontal memory layer underlies and is in contact with the first electrode, and an upper end of the memory element located on the first planar surface is in contact with the horizontal memory layer.

* * * * *